(12) United States Patent
Kinoshita et al.

(10) Patent No.: US 7,781,144 B2
(45) Date of Patent: Aug. 24, 2010

(54) POSITIVE RESIST COMPOSITION AND RESIST PATTERN FORMING METHOD

(75) Inventors: Yohei Kinoshita, Kanagawa-ken (JP); Waki Ohkubo, Kanagawa-ken (JP); Yusuke Nakagawa, Kanagawa-ken (JP); Shinichi Hidesaka, Kanagawa-ken (JP); Makiko Irie, Kanagawa-ken (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 135 days.

(21) Appl. No.: 11/914,509

(22) PCT Filed: Apr. 18, 2006

(86) PCT No.: PCT/JP2006/308124

§ 371 (c)(1),
(2), (4) Date: Nov. 15, 2007

(87) PCT Pub. No.: WO2006/123496

PCT Pub. Date: Nov. 23, 2006

(65) Prior Publication Data

US 2009/0035698 A1      Feb. 5, 2009

(30) Foreign Application Priority Data

May 17, 2005   (JP) .............................. 2005-143969

(51) Int. Cl.
G03F 7/039   (2006.01)
G03F 7/20    (2006.01)
G03F 7/30    (2006.01)

(52) U.S. Cl. ..................... 430/270.1; 430/326; 430/910; 430/919; 430/920; 430/921; 430/922; 430/925

(58) Field of Classification Search ........................ None
See application file for complete search history.

(56) References Cited

U.S. PATENT DOCUMENTS

| | | | |
|---|---|---|---|
| 5,770,346 | A | 6/1998 | Iwasa et al. |
| 5,985,522 | A | 11/1999 | Iwasa et al. |
| 5,994,025 | A | 11/1999 | Iwasa et al. |
| 6,111,143 | A | 8/2000 | Park et al. |
| 6,664,022 | B1 | 12/2003 | Cameron et al. |
| 6,982,140 | B2 | 1/2006 | Hada et al. |
| 2002/0177068 | A1 | 11/2002 | Park et al. |
| 2004/0023153 | A1 | 2/2004 | Takeda et al. |
| 2004/0072094 | A1 | 4/2004 | Shima et al. |
| 2005/0186505 | A1* | 8/2005 | Kodama et al. .......... 430/270.1 |

FOREIGN PATENT DOCUMENTS

| | | | |
|---|---|---|---|
| EP | 1 262 830 | A | 12/2002 |
| JP | 10-133375 | | 5/1998 |
| JP | 2881969 | | 4/1999 |
| JP | 2000-181054 | | 6/2000 |
| JP | A 2003-167347 | | 6/2003 |
| JP | 2003-212823 | | 7/2003 |
| JP | 2004-062154 | A | 2/2004 |
| JP | 2004-126013 | | 4/2004 |
| JP | 2004-151364 | A | 5/2004 |
| JP | 2005-37888 | | 2/2005 |
| JP | 2005-99556 | * | 4/2005 |
| WO | WO 2005-075446 | | 8/2005 |

OTHER PUBLICATIONS

Machine-assisted English translation of JP 2005-99556.*
DERWENT English abstract for JP2005-37888 (Haneda et al)—Feb. 2005.*
Ogata et al., "Effects of Protecting Group on Resist Characteristics of Acryl Polymers for 193 nm Lithography," Journal of Photopolymer Science and Technology, vol. 17, No. 4 (2004) pp. 483-488.
European Search Report issued in corresponding European Patent Application No. 06732052.3, dated Jan. 29, 2010.
Decision of Grant of Patent issued on Korean patent application No. 2007-7027126, dated Aug. 17, 2009.

* cited by examiner

*Primary Examiner*—Sin J. Lee
(74) *Attorney, Agent, or Firm*—Knobbe, Martens, Olson & Bear, LLP

(57) ABSTRACT

The present invention is a positive resist composition and a resist pattern forming method including a resin component (A) which has a polymer compound (A1) having a structural units (a1) including an acetal type acid dissociable, dissolution inhibiting group, a structural unit (a2) derived from an acrylate ester having a lactone-containing polycyclic group, and a structural unit (a3) derived from an acrylate ester having a polar group-containing aliphatic hydrocarbon group, and an acid generator component (B) having an onium salt-based acid generator (B1) having a cation portion represented by a general formula (b-1) shown below

[Chemical Formula 1]

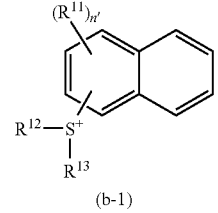

(b-1)

[wherein, $R^{11}$ represents an alkyl group, an alkoxy group, a halogen atom or a hydroxyl group; $R^{12}$ to $R^{13}$ each represents, independently, an aryl group or the alkyl group that may have substituent group; n' represents either 0 or an integer from 1 to 3].

4 Claims, No Drawings

POSITIVE RESIST COMPOSITION AND RESIST PATTERN FORMING METHOD

RELATED APPLICATIONS

This application is the U.S. National Phase filing under 35 U.S.C. §371 of PCT/JP2006/308124, filed Apr. 18, 2006, which designated the United States and was published in a language other than English, which claims priority under 35 U.S.C. §119(a)-(d) to Japanese Patent Application No. 2005-143969 filed May 17, 2005. The content of these applications is incorporated herein by reference in their entireties.

TECHNICAL FIELD

The present invention relates to a positive resist composition and a resist pattern forming method.

BACKGROUND ART

In recent years, in the production of semiconductor elements and liquid crystal display elements, advances in lithography techniques have led to rapid progress in the field of miniaturization. Typically, these miniaturization techniques involve shortening of the wavelength of the exposure light source. Until recently, ultraviolet radiation such as g-lines and i-lines has been used as the exposure light source, but recently, mass production using KrF excimer lasers (248 nm) has been started, and even ArF excimer lasers (193 nm) are now starting to be introduced. Radiation of even shorter wavelengths such as $F_2$ excimer lasers (157 nm), EUV (extreme ultraviolet radiation), electron beams, X-rays and soft X-rays is also being investigated.

Resists for use with these types of short wavelength light sources require a high resolution capable of reproducing patterns of minute dimensions, and a high level of sensitivity relative to these types of short wavelength light sources. One example of a known resist that satisfies these conditions is a chemically amplified resist, which includes a base resin and an acid generator (hereafter referred to as a PAG) that generates acid upon exposure, and these chemically amplified resists include positive resists in which the alkali solubility of the exposed portions increases, and negative resists in which the alkali solubility of the exposed portions decreases.

Until recently, polyhydroxystyrene (PHS) or derivative resins thereof in which the hydroxyl groups have been protected with acid-dissociable, dissolution-inhibiting groups (PHS-based resins), which exhibit high transparency relative to a KrF excimer laser (248 nm), have been used as the base resin component of chemically amplified resists. However, because PHS-based resins contain aromatic rings such as benzene rings, their transparency is inadequate for light with wavelengths shorter than 248 nm, such as light of 193 nm. Accordingly, chemically amplified resists that use a PHS-based resin as the base resin component suffer from low levels of resolution in processes that, for example, use light of 193 nm.

As a result, resins that contain structural units derived from (meth)acrylate esters within the principal chain (acrylic resins) are now generally used as base resins for resists that use ArF excimer laser lithography, as they offer excellent transparency in the vicinity of 193 nm. Furthermore in the case of positive resists, as disclosed in the Patent Reference 1 listed below, resins that contain structural units derived from tertiary ester compounds of (meth)acrylic acid such as 2-alkyl-2-adamantyl (meth)acrylates as the structural units containing an acid-dissociable, dissolution-inhibiting group are now widely used. These resins are known to exhibit a high dissociation energy for the acid-dissociable, dissolution-inhibiting groups, meaning there are restrictions on the types of acid generators that can be used within resist compositions that use these resins. In other words, unless an acid generator that generates a strong acid is used, such as an onium salt containing a fluorinated alkylsulfonate ion as the anion, the acid-dissociable, dissolution-inhibiting groups do not dissociate satisfactorily, and the composition is unable to function satisfactorily as a resist.

In recent years, resins containing structural units in which the hydrogen atom of (meth)acrylic acid has been substituted with a so-called acetal group such as a 1-alkoxyalkyl group have been attracting considerable attention as resins containing acid-dissociable, dissolution-inhibiting groups for use within ArF excimer laser lithography and the like (see non-patent reference 1).

[Patent Reference 1]
Japanese Patent (Granted) Publication No. 2,881,969
[Non-Patent Reference 1]
J. Photopolym. Sci. Technol. 17 (2004), 483 to 488

DISCLOSURE OF INVENTION

Problems to be Solved by the Invention

However, in order to achieve a minute resist pattern, though it is important to reduce the fluctuation in pattern size, when a resist pattern is formed using positive resist compositions including acetal groups as acid dissociable, dissolution inhibiting groups, a problem occur in that the fluctuation in pattern size becomes large while exposure varies.

In addition, "the fluctuation in pattern size while the exposure varies" is generally described as "EL margin (exposure margin)".

The present invention has been made under these circumstances and it is an object of the present invention to provide a positive resist composition and a resist pattern forming method which reduce the fluctuation in pattern size while the exposure varies.

Means for Solving the Problems

In order to achieve the objects above, the present invention adopts the constituent features below.

A first aspect in accordance with the present invention provides a positive resist composition which includes a resin component (A) that exhibits increased alkali solubility under action of acid and an acid generator component (B) that generates acid on exposure to radiation, wherein the resin component (A) includes a polymer compound (A1), wherein the polymer compound (A1) includes one or more structural units (a1) selected from the group consisting of structural units represented by general formulas (a1-2) and (a1-4) shown below:

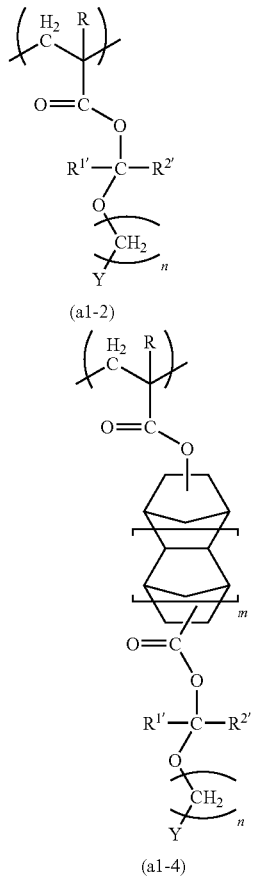

[Chemical Formula 1]

(a1-2)

(a1-4)

[wherein, Y represents a lower alkyl group or an aliphatic cyclic group; n represents either 0 or an integer from 1 to 3; m represents either 0 or 1; R represents a hydrogen atom, fluorine atom, lower alkyl group, or fluorinated lower alkyl group; and $R^{1'}$ and $R^{2'}$ each represents, independently, a hydrogen atom or a lower alkyl group], a structural unit (a2) derived from an acrylate ester that contains a lactone-containing monocyclic or polycyclic group, and a structural unit (a3) derived from an acrylate ester that contains a polar group-containing aliphatic hydrocarbon group; and the component (B) includes: an onium salt-based acid generator (B1) having a cation portion represented by a general formula (b-1) shown below:

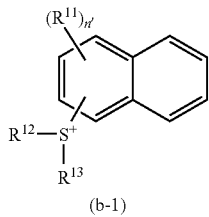

[Chemical Formula 2]

(b-1)

[wherein, $R^{11}$ represents an alkyl group, an alkoxy group, a halogen atom or a hydroxyl group; $R^{12}$ to $R^{13}$ each represents, independently, an aryl group or an alkyl group that may have a substituent group; n' represents either 0 or an integer from 1 to 3].

A second aspect in accordance with the present invention provides a resist pattern forming method that includes the steps of: forming a resist film on a substrate using the positive resist composition of the present invention, conducting selective exposure of the resist film, and alkali developing the resist film to form a resist pattern.

EFFECTS OF THE INVENTION

The present application provides a positive resist composition and a resist pattern forming method which can reduce the fluctuation in pattern size while the exposure varies.

DETAILED DESCRIPTION OF THE INVENTION

<<Positive Resist Composition>>

The positive resist composition of the present invention includes a resin component (A) that exhibits increased alkali solubility under the action of acid (hereafter referred to as the component (A)), and an acid generator component (B) that generates acid on exposure to radiation (hereafter referred to as the component (B)).

In the positive resist composition of the present invention, because the component (A) includes a structural unit (a1) that contains a so-called acid-dissociable, dissolution-inhibiting group, the component (A) is insoluble in alkali prior to exposure, but the action of the acid generated from the component (B) upon exposure causes the acid-dissociable, dissolution-inhibiting groups to dissociate, thereby increasing the alkali solubility of the entire component (A), and causing the resin component to change from an alkali-insoluble state to an alkali-soluble state. As a result, when the resist film obtained using the positive resist composition is selectively exposed during the formation of a resist pattern, or alternatively, is exposed and then subjected to post-exposure baking (PEB), the exposed portions of the resist shift to an alkali-soluble state, whereas the unexposed portions remain insoluble in alkali, meaning that alkali developing can then be used to form a positive resist pattern.

<Component (A)>

In the present invention, the component (A) includes a polymer compound (A1) (hereafter referred to as the component (A1)) which has a structural unit (a1), a structural unit (a2), and a structural unit (a3) described below.

Structural Unit (a1)

The structural unit (a1) includes one or more structure units selected from the group consisting of structural units represented by the general formulas (a1-2) and (a1-4) shown above. Including the structural unit (a1) enables the effects of the present invention to be obtained.

The structural unit (a1) is a structural unit in which an acetal group (alkoxyalkyl group) type acid-dissociable, dissolution-inhibiting group represented by a formula —C($R^{1'}$)($R^{2'}$)—O(CH$_2$)$_n$—Y is bonded to the oxygen atom at the terminal of a carbonyloxy group (—C(O)—O—) derived from a carboxyl group.

In the formulas (a1-2) and (a1-4), R represents a hydrogen atom, fluorine atom, lower alkyl group, or fluorinated lower alkyl group.

Lower alkyl groups represented by R are preferably alkyl groups of 1 to 5 carbon atoms, and are preferably straight-chained or branched-chained alkyl groups, and specific examples include a methyl group, ethyl group, propyl group, isopropyl group, n-butyl group, isobutyl group, tert-butyl group, pentyl group, isopentyl group, and neopentyl group. From an industrial viewpoint, R is preferably a methyl group.

A fluorinated lower alkyl group is a group in which either a portion of, or all of, the hydrogen atoms of an above lower alkyl group of 1 to 5 carbon atoms have been substituted with fluorine atoms. In the present invention, groups in which all of the hydrogen atoms have been fluorinated are preferred. The fluorinated lower alkyl group is preferably a straight-chained or branched-chained fluorinated lower alkyl group, a trifluoromethyl group, hexafluoroethyl group, heptafluoropropyl group, a nonafluorobutyl group is even more preferred, and a trifluoromethyl group (—$CF_3$) is the most preferable.

The R group is preferably a hydrogen atom, trifluoromethyl group, or methyl group, and a methyl group is the most preferable.

$R^{1'}$ and $R^{2'}$ each represents, independently, a hydrogen atom or a lower alkyl group. Examples of suitable lower alkyl groups for $R^{1'}$ and $R^{2'}$ include the same lower alkyl groups as those exemplified above in relation to the R group. In the present invention, from the viewpoint of suppressing pattern collapse, at least one of $R^{1'}$ and $R^{2'}$ is preferably a hydrogen atom, and those cases in which both $R^{1'}$ and $R^{2'}$ are hydrogen atoms are even more desirable.

n represents either 0 or an integer from 1 to 3, preferably either 0 or an integer from 1 to 2, even more preferably either 0 or 1, and is most preferably 1.

Y represents a lower alkyl group or an aliphatic cyclic group.

Examples of suitable lower alkyl groups for Y include the same lower alkyl groups as those exemplified above in relation to the R group.

An aliphatic cyclic group represented by Y can be selected from the multitude of monocyclic and polycyclic aliphatic cyclic groups proposed for use within conventional ArF resists and the like.

In this description and in the claims, the term "aliphatic" is a relative concept used in relation to the term "aromatic", and defines a group or compound or the like that contains no aromaticity. The term "aliphatic cyclic group" describes a monocyclic group or polycyclic group that contains no aromaticity.

The aliphatic cyclic group may contain a substituent group, or may contain no substituent groups. Examples of suitable substituent groups include lower alkyl groups of 1 to 5 carbon atoms, a fluorine atom, fluorinated lower alkyl groups of 1 to 5 carbon atoms that have been substituted with fluorine atoms, and an oxygen atom (=O).

In the aliphatic cyclic group, the basic ring structure not including the substituent groups may be either a hydrocarbon group formed solely from carbon and hydrogen (an alicyclic group), or a heterocyclic group in which a portion of the carbon atoms that constitute the ring structure of the alicyclic group have been substituted with a hetero atom (such as an oxygen atom or nitrogen atom), although an alicyclic group is preferred.

The aliphatic cyclic group may be either saturated or unsaturated, but is preferably saturated.

Specific examples of the aliphatic cyclic group include monocyclic groups of 5 to 7 carbon atoms, and polycyclic groups of 10 to 16 carbon atoms. Examples of aliphatic monocyclic groups of 5 to 7 carbon atoms include groups in which one hydrogen atom has been removed from a monocycloalkane, and specific examples include groups in which one hydrogen atom has been removed from cyclopentane or cyclohexane. Examples of aliphatic polycyclic groups of 10 to 16 carbon atoms include groups in which one hydrogen atom has been removed from a bicycloalkane, tricycloalkane or tetracycloalkane or the like, and specific examples include groups in which one hydrogen atom has been removed from a polycycloalkane such as adamantane, norbornane, isobornane, tricyclodecane or tetracyclododecane. Of these, aliphatic polycyclic groups are preferred, and from an industrial viewpoint an adamantyl group, norbornyl group or tetracyclododecanyl group is preferred, and an adamantyl group is particularly desirable.

Specific examples of the acid-dissociable, dissolution-inhibiting group represented by the general formula —$C(R^{1'})R^{2'}$—$O(CH_2)_n$—Y within the formulas (a1-2) and (a1-4) include chemical structure groups (a1-Y-i) with structures represented by the chemical formulas shown below.

Chemical Structure Groups (a1-Y-i)

[Chemical Formula 3]

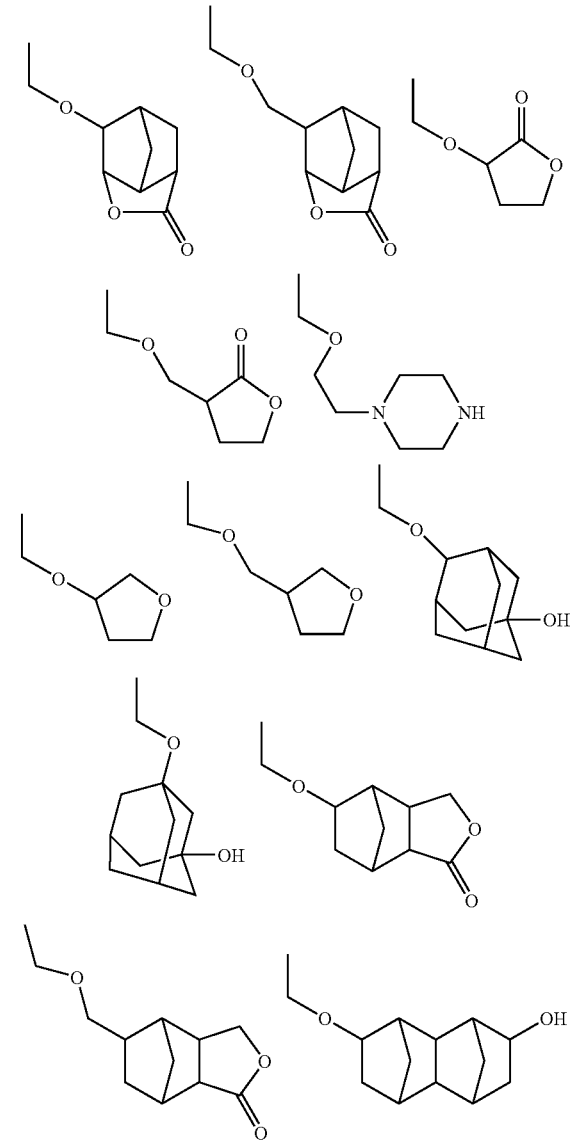

-continued
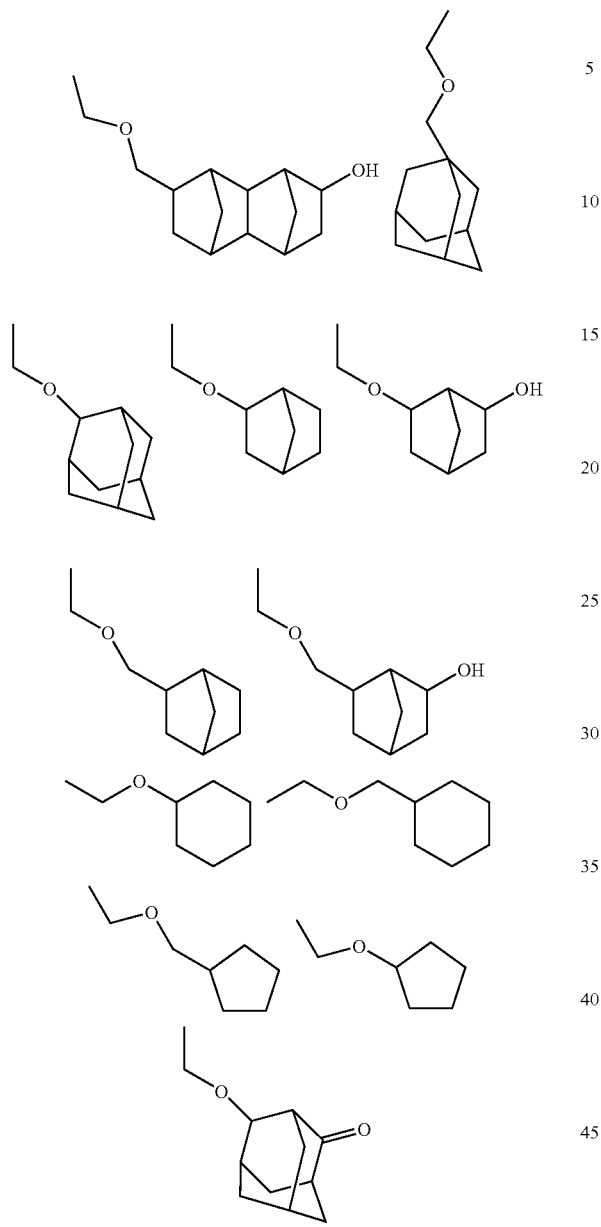
Specific examples of the structural units represented by the above general formulas (a1-2) and (a1-4) are shown (a1-2-1) to (a1-2-21) and (a1-4-1) to (a1-4-30) below.
[Chemical Formula 4]
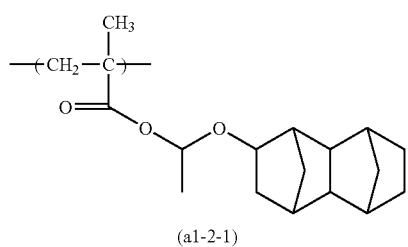
(a1-2-1)
-continued
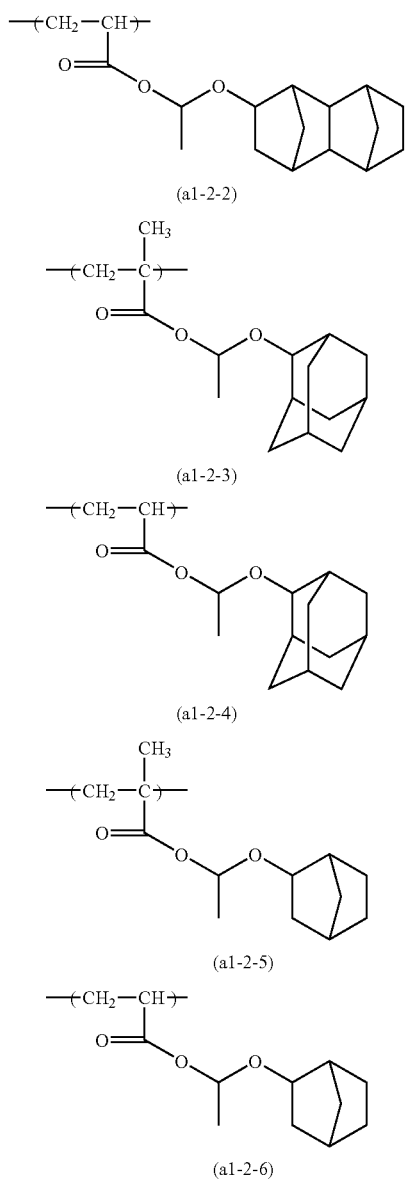
[Chemical Formula 5]
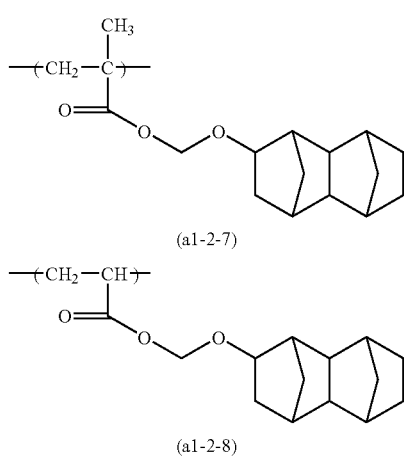

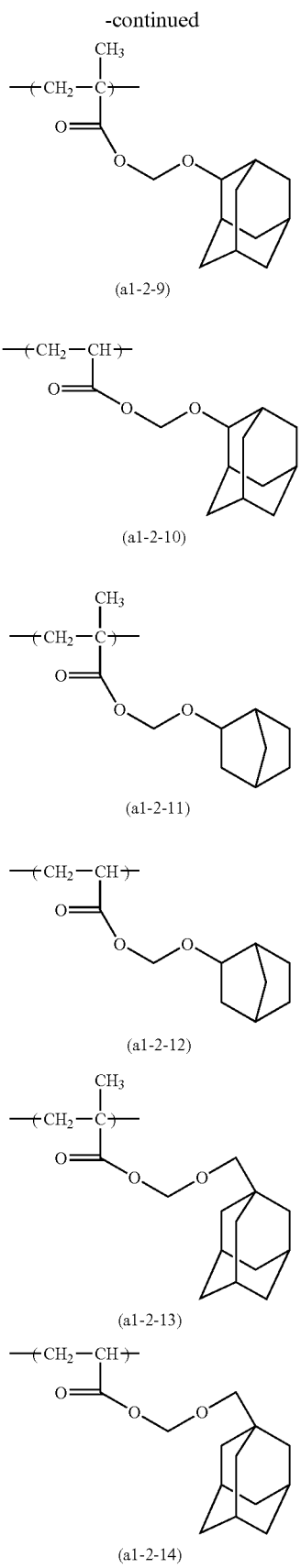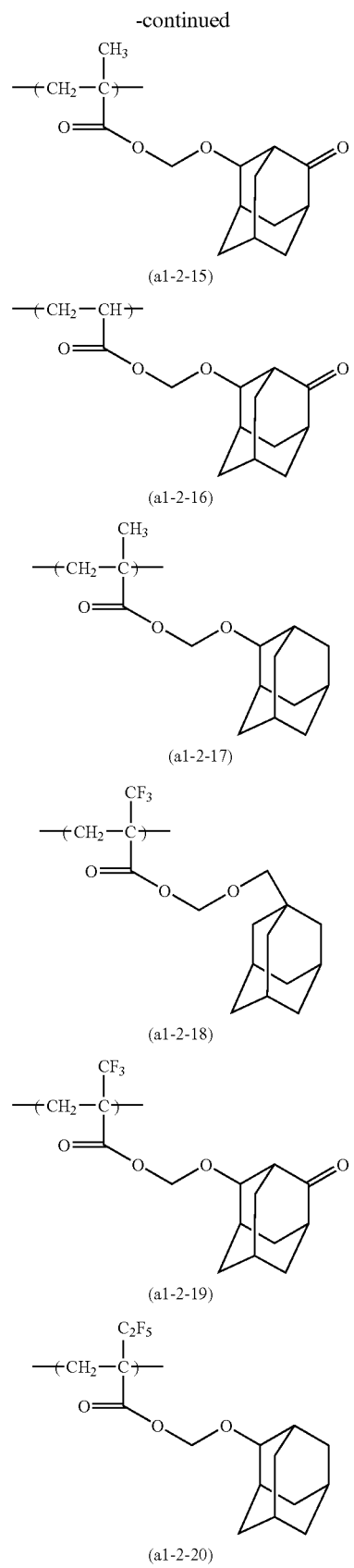

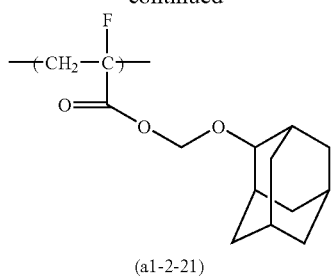
(a1-2-21)
[Chemical Formula 6]
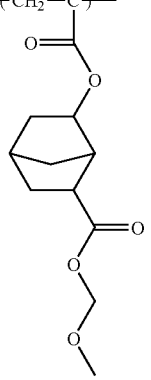
(a1-4-1)
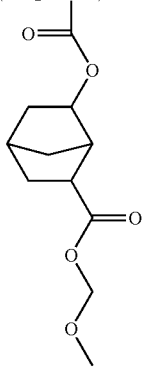
(a1-4-2)
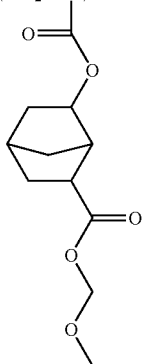
(a1-4-3)
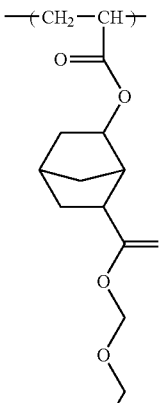
(a1-4-4)
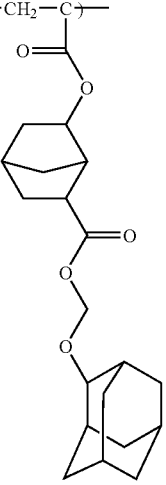
(a1-4-5)
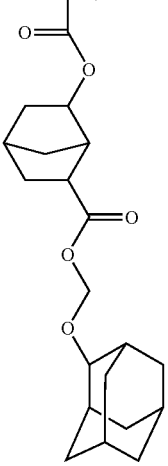
(a1-4-6)

-continued
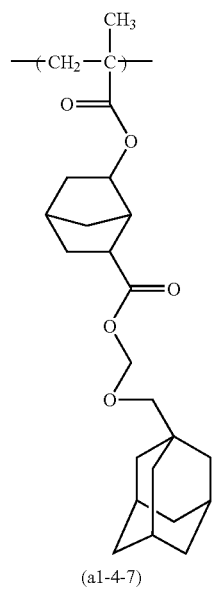
(a1-4-7)
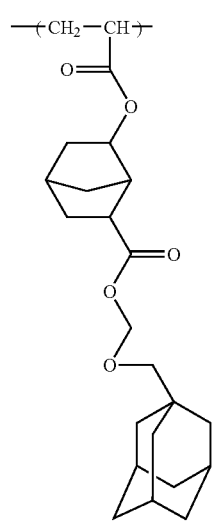
(a1-4-8)
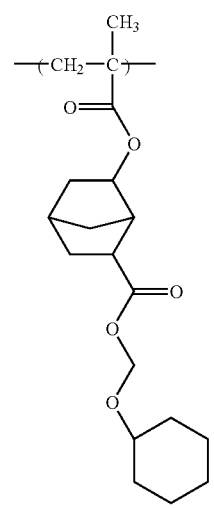
(a1-4-9)
-continued
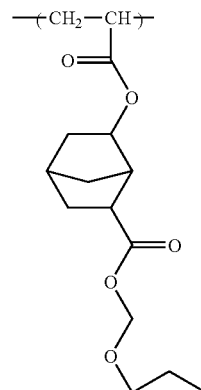
(a1-4-10)
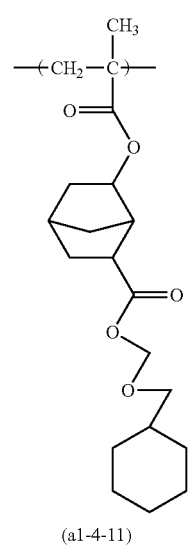
(a1-4-11)
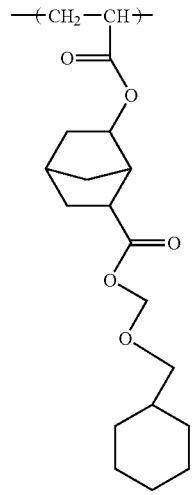
(a1-4-12)

-continued
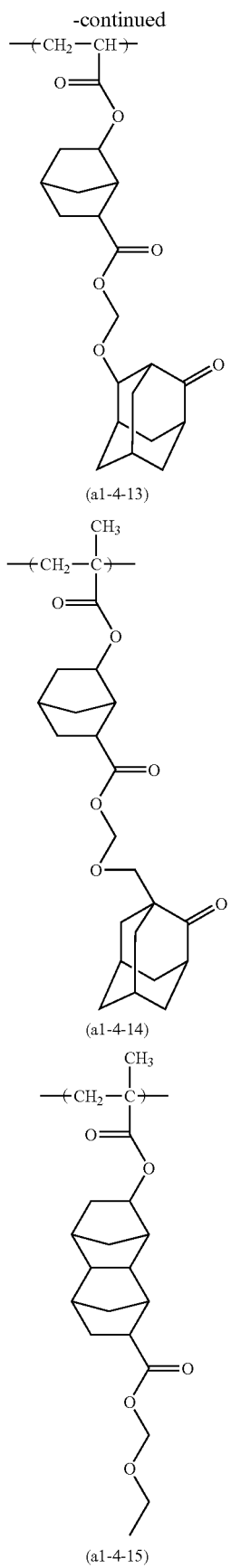
(a1-4-13)
(a1-4-14)
(a1-4-15)
-continued
[Chemical Formula 7]
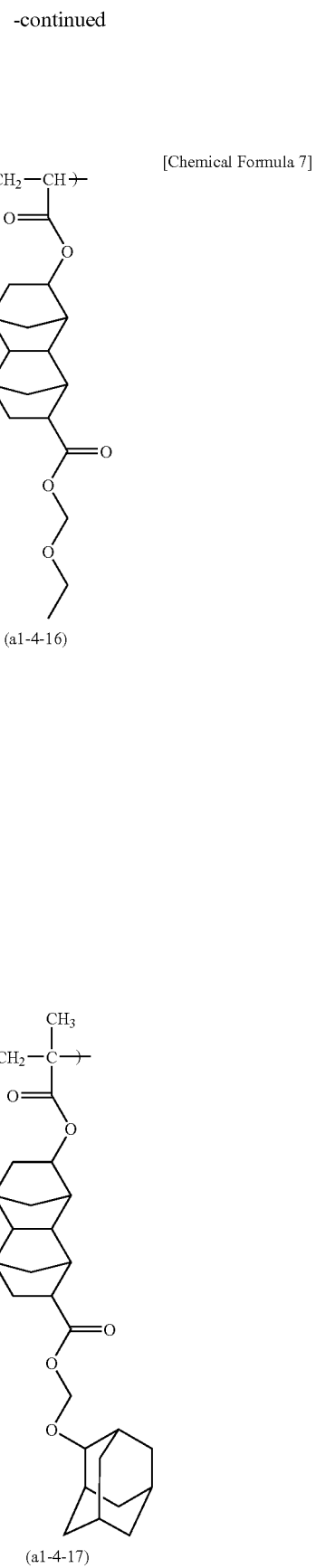
(a1-4-16)
(a1-4-17)

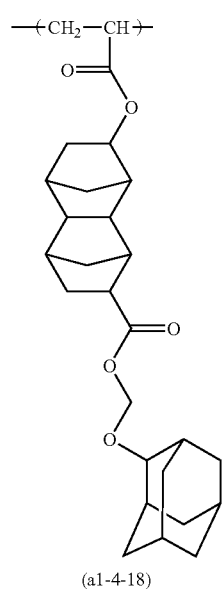
(a1-4-18)
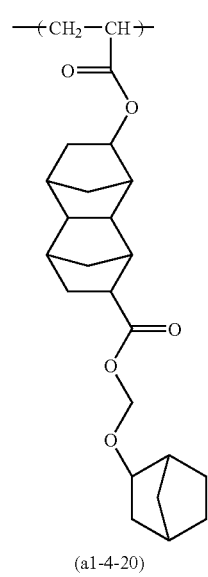
(a1-4-20)
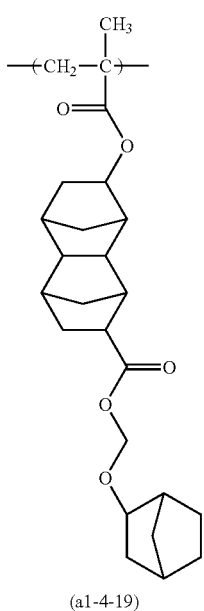
(a1-4-19)
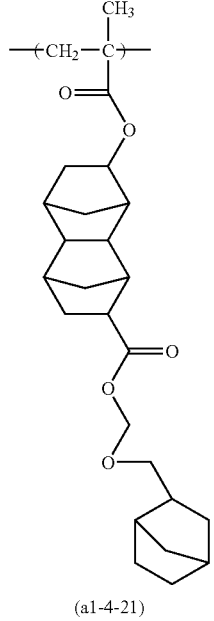
(a1-4-21)

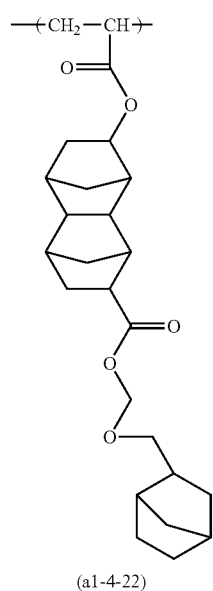
(a1-4-22)
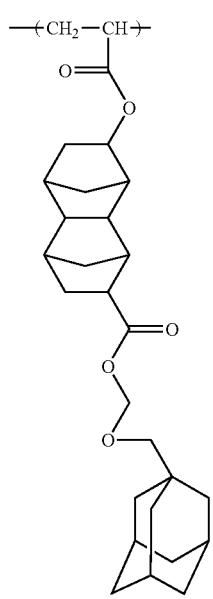
(a1-4-24)
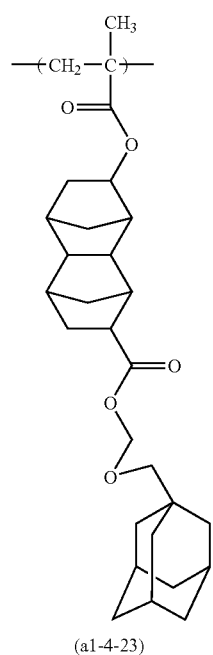
(a1-4-23)
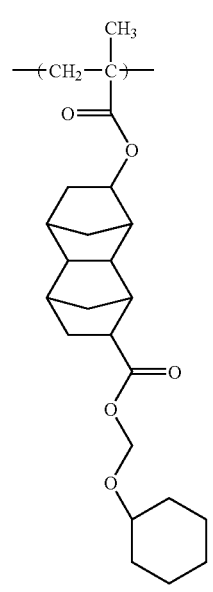
(a1-4-25)

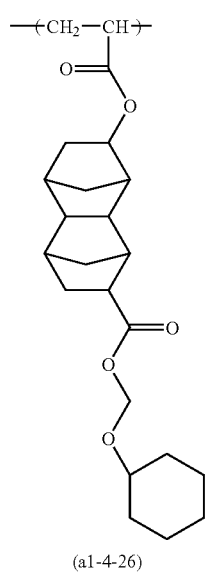
(a1-4-26)
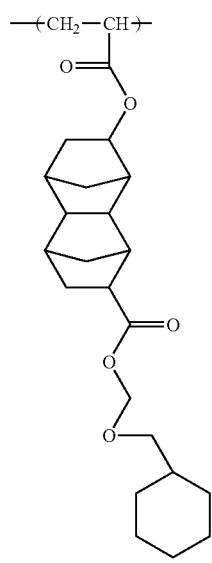
(a1-4-28)
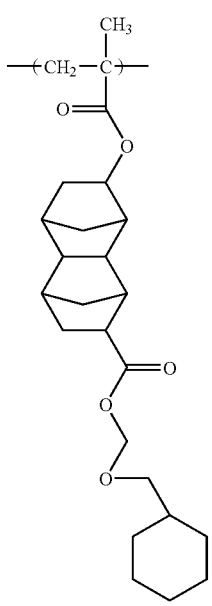
(a1-4-27)
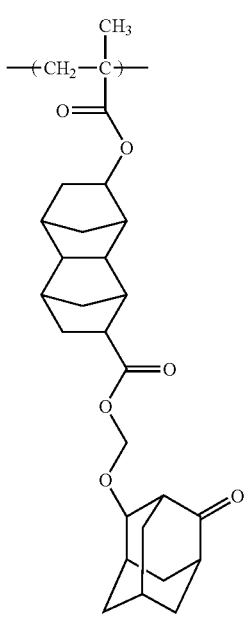
(a1-4-29)

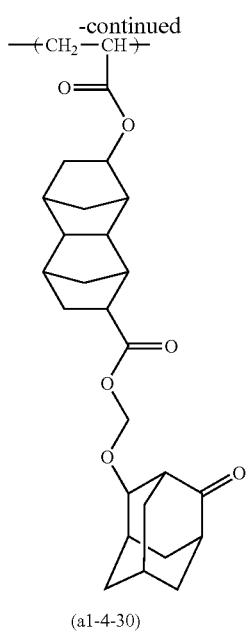

(a1-4-30)

As the structural unit (a1), structural units represented by the above general formula (a1-2) are preferred, and of these, structural units represented by a general formula (2) shown below are particularly desirable.

[Chemical Formula 8]

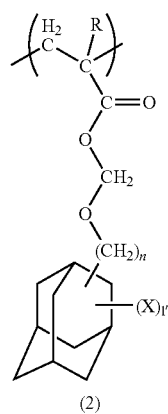

(2)

[wherein, R represents a hydrogen atom, fluorine atom, lower alkyl group, or fluorinated lower alkyl group; n represents either 0 or an integer from 1 to 3; X represents a polar group; and 1' represents either 0 or an integer from 1 to 3]

In the formula (2), R and n are the same as R and n within the above formula (a1-2).

Examples of the polar group represented by X include a hydroxyl group, cyano group, carboxyl group, or a fluorinated hydroxyalkyl group in which a portion of the hydrogen atoms bonded to carbon atoms within a hydroxyalkyl group of 1 to 5 carbon atoms have been substituted with fluorine atoms. Of these, a hydroxyl group or carboxyl group is preferred. Furthermore, X is not restricted to monovalent groups, and an oxygen atom (=O, this oxygen atom forms a carbonyl group together with a carbon atom that constitutes part of the ring structure) is also desirable.

1' is preferably either 0 or 1, and is most preferably 0.

Furthermore, X is most preferably an oxygen atom, and in such cases, the number of oxygen atoms is preferably 1.

Of the structural units represented by the above general formula (2), structural units represented by general formulas (3), (4), and (3') shown below are preferred, and of these, structural units represented by the general formulas (3) and (3') are particularly desirable. These structural units yield favorable resolution and resist pattern shape. Furthermore, the exposure area dependency is also favorable, and the exposure area margin is improved, which is also desirable. The exposure area margin relates to a problem wherein changes in the mask coverage ratio or the coordinates within the cell (whether a specified position is near the periphery or within the center of the cell within the apparatus) cause variation in the resist shape or dimensions. It is thought that the reason the exposure area margin improves is because the acid-dissociable, dissolution-inhibiting group represented by the formula $—C(R^1)R^{2'})—O(CH_2)_n—Y$ has an extremely low deprotection energy, and the deprotection reaction proceeds just with the exposure energy, meaning the resist is resistant to effects resulting from dispersion or deactivation of the acid. Furthermore, even on an inorganic substrate such as a SiON substrate, a resist pattern with favorable resolution and resist pattern shape can be formed.

[Chemical Formula 9]

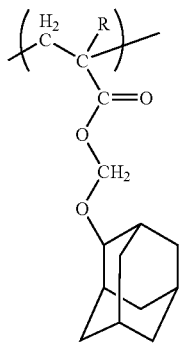

[wherein, R represents a hydrogen atom, fluorine atom, lower alkyl group, or fluorinated lower alkyl group]

[Chemical Formula 10]

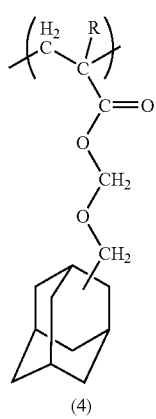

(4)

[wherein, R represents a hydrogen atom, fluorine atom, lower alkyl group, or fluorinated lower alkyl group]

[Chemical Formula 11]

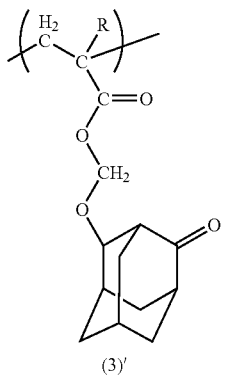

(3)'

[wherein, R represents a hydrogen atom, fluorine atom, lower alkyl group, or fluorinated lower alkyl group]

As the structural unit (a1), either a single structural unit may be used alone, or a combination of two or more different structural units may be used.

The proportion of the structural unit (a1) within the component (A), relative to the combined total of all the structural units that constitute the component (A), is preferably within a range from 10 to 80 mol %, even more preferably from 20 to 60 mol %, even more preferably from 30 to 50 mol %, and is most preferably from 35 to 45 mol %. By ensuring that this proportion is at least as large as the lower limit of the above range, a very fine pattern can be obtained when the component (A) is used to form a resist composition, whereas ensuring that the proportion is no greater than the upper limit enables a more favorable balance to be achieved with the other structural units.

Structural Unit (a2)

The structural unit (a2) is a structural unit derived from an acrylate ester that contains a lactone-containing monocyclic or polycyclic group. Including the structural unit (a2) enables the effects of the present invention to be obtained. Furthermore, the structural unit (a2) also improves the adhesion between the resist film and the substrate, and reduces the likelihood of pattern collapse or film peeling, even for very fine resist patterns. Furthermore, the structural unit (a2) enhances the hydrophilicity of the component (A), thereby improving the affinity with the developing solution, improving the alkali solubility within the exposed portions of the resist, and contributing to an improvement in the resolution.

In the structural unit (a2), a hydrogen atom, fluorine atom, lower alkyl group, or fluorinated lower alkyl group is bonded to the α-position carbon atom, and specific examples include the same groups as those exemplified above in relation to the group R in the structural unit (a1).

The expression "lactone-containing monocyclic or polycyclic group" refers to a cyclic group that includes a single ring containing a —O—C(O)-structure (a lactone ring). This lactone ring is counted as the first ring, and groups that contain only the lactone ring are referred to as monocyclic groups, whereas groups that also contain other ring structures are described as polycyclic groups regardless of the structure of the other rings.

As the structural unit (a2), any group can be used without any particular restrictions, provided it includes both the above type of lactone structure (—O—C(O)—) and a cyclic group, and specific examples include structural units in which a monocyclic group formed from a lactone ring, or a polycyclic group that contains a lactone ring and an alicyclic group bonded thereto, is bonded to the ester side-chain portion of the acrylate ester.

Specifically, examples of lactone-containing monocyclic groups include groups in which one hydrogen atom has been removed from γ-butyrolactone. Furthermore, examples of lactone-containing polycyclic groups include groups in which one hydrogen atom has been removed from a lactone ring-containing bicycloalkane, tricycloalkane, or tetracycloalkane. Groups obtained by removing one hydrogen atom from a lactone-containing tricycloalkane with a structural formula such as those shown below (Chemical structure groups (a2-i)) are particularly preferred in terms of factors such as industrial availability.

Chemical Structure Groups (a2-i)

[Chemical Formula 12]

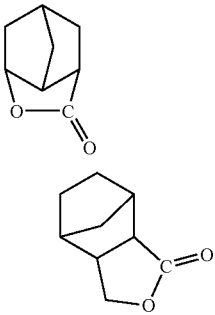

More specific examples of the structural unit (a2) include the structural units represented by general formulas (a2-1) to (a2-5) shown below.

[Chemical Formula 13]

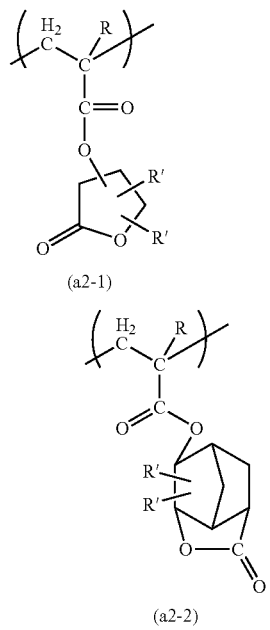

(a2-1)

(a2-2)

-continued

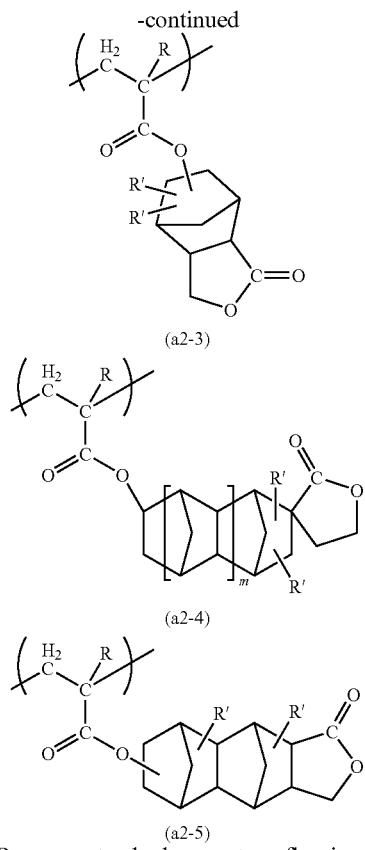

(a2-3)

(a2-4)

(a2-5)

[wherein, R represents a hydrogen atom, fluorine atom, lower alkyl group or fluorinated lower alkyl group, each R' represents a hydrogen atom, a lower alkyl group, or an alkoxy group of 1 to 5 carbon atoms, and m represents an integer of 0 or 1]

The group R within the general formulas (a2-1) to (a2-5) is as defined above for R in the above structural unit (a1), and suitable examples of the group include the same groups as those exemplified above.

Examples of the lower alkyl group of R' include the same lower alkyl groups as those exemplified above for the group R in the structural unit (a1).

Considering factors such as industrial availability, R' within the general formulas (a2-1) to (a2-5) is preferably a hydrogen atom.

Specific examples of structural units represented by the above general formulas (a2-1) to (a2-5) are shown below.

Examples of (a2-1):

[Chemical Formula 14]

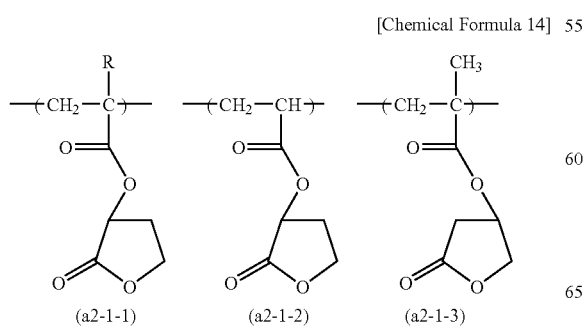

(a2-1-1)    (a2-1-2)    (a2-1-3)

-continued

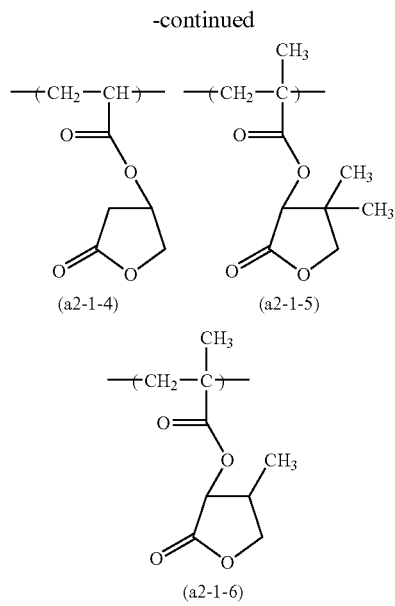

(a2-1-4)    (a2-1-5)

(a2-1-6)

Examples of (a2-2):

[Chemical Formula 15]

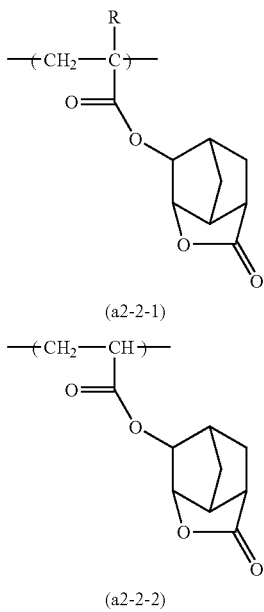

(a2-2-1)

(a2-2-2)

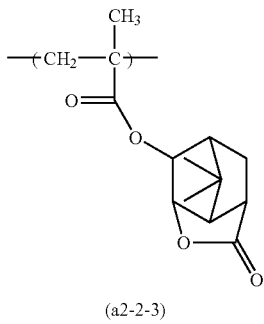

(a2-2-3)

-continued
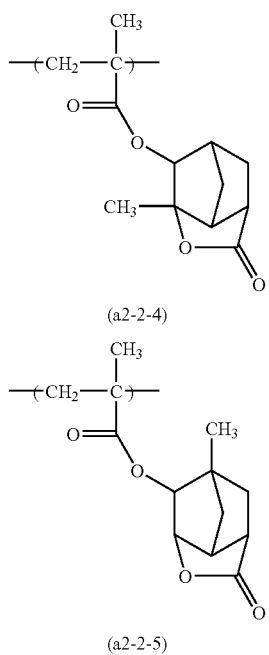
(a2-2-4)
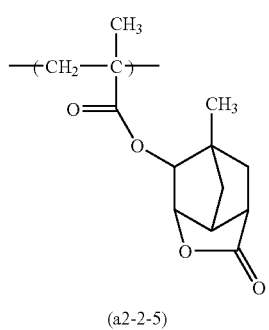
(a2-2-5)
Examples of (a2-3):
[Chemical Formula 16]
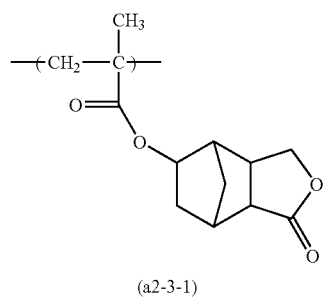
(a2-3-1)
(a2-3-2)
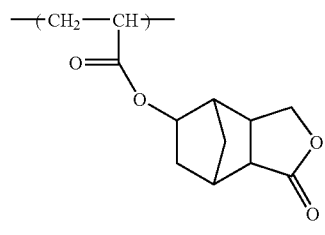
(a2-3-3)
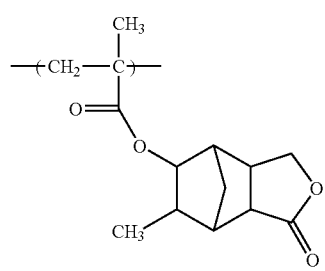
-continued
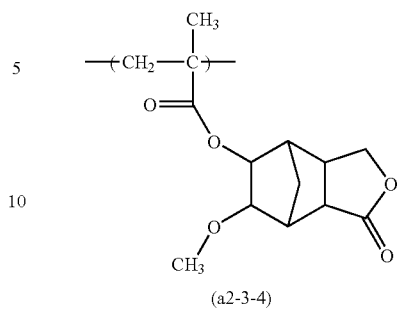
(a2-3-4)
(a2-3-5)
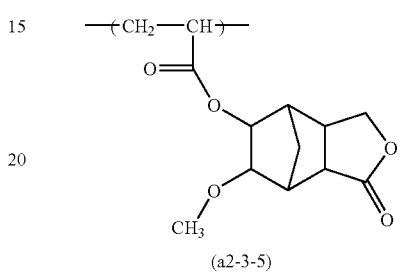
(a2-3-6)
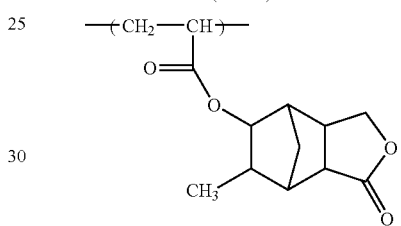
(a2-3-7)
(a2-3-8)
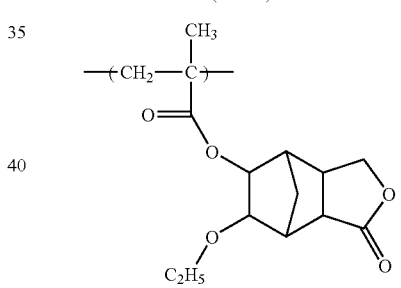
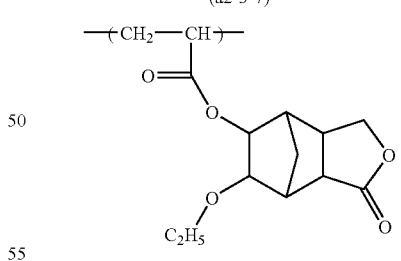
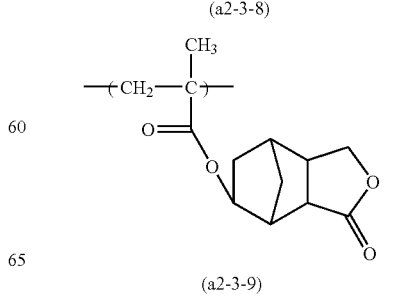
(a2-3-9)

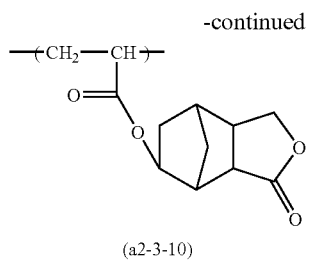
(a2-3-10)
Examples of (a2-4):
[Chemical Formula 17]
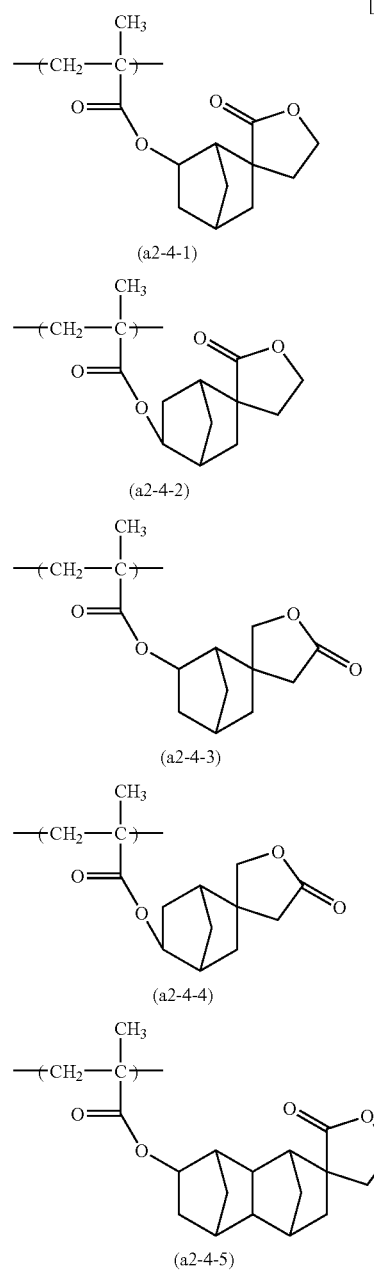
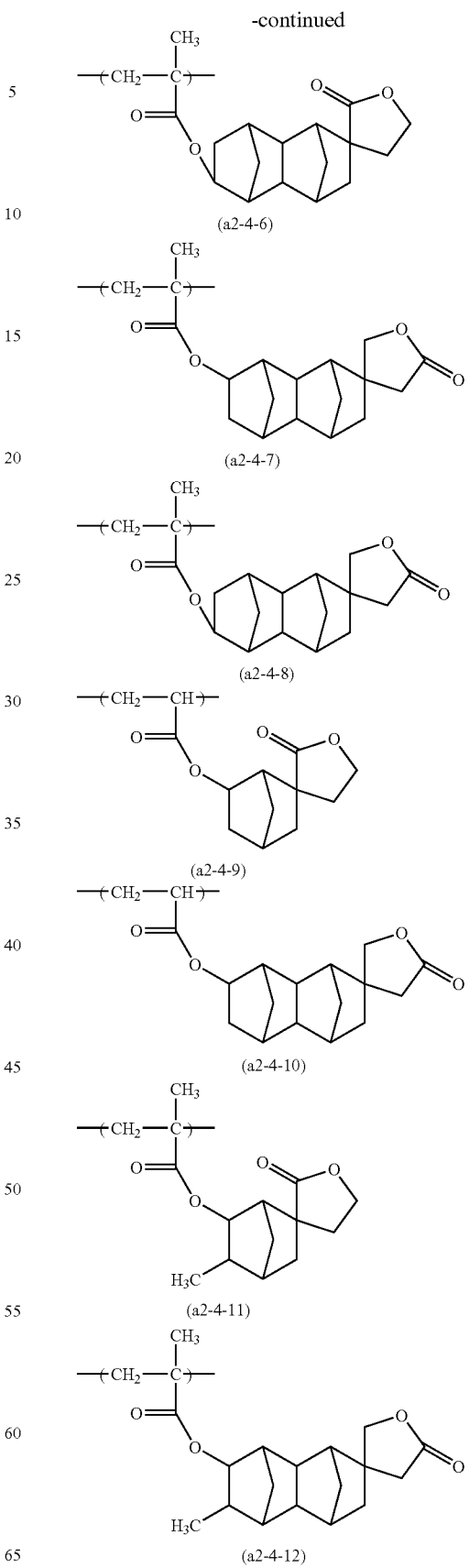

Examples of (a2-5):

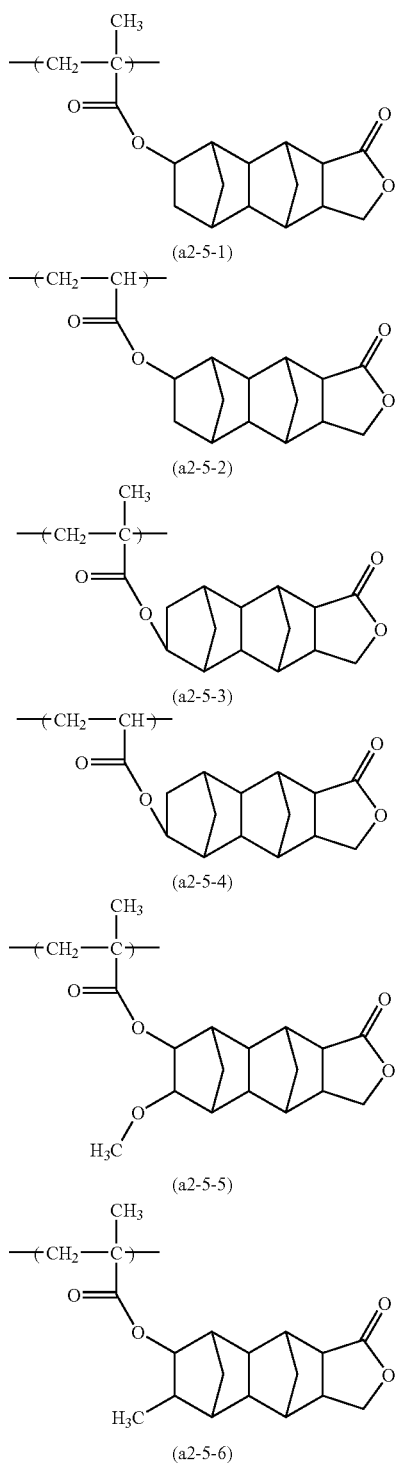

[Chemical Formula 18]

(a2-5-1)
(a2-5-2)
(a2-5-3)
(a2-5-4)
(a2-5-5)
(a2-5-6)

Of the above structural units, the use of one or more units selected from units of the general formulas (a2-1) to (a2-3) is preferred.

In other words, butyrolactone esters of acrylic acid represented by the general formula (a2-1), namely, structural units derived from the acrylate esters of various butyrolactones, are preferred in terms of the effects of the present invention, and of these units, structural units derived from the γ-butyrolactone ester of acrylic acid, in which all of the R' groups are hydrogen atoms and the ester linkage is formed at the α-carbon atom on the lactone skeleton, namely, structural units derived from the acrylate ester of γ-butyrolactone are the most desirable. Furthermore, structural units derived from the acrylate ester of γ-butyrolactone are also preferred in terms of their superior effect in suppressing and reducing the proximity effect.

Furthermore, norbornane lactone esters of acrylic acid represented by the general formulas (a2-2) and (a2-3), namely, structural units derived from the acrylate esters of various norbornane lactones, are also preferred as they yield a favorable resist pattern shape, and particularly favorable rectangular formability.

Specifically, the use of at least one structural unit selected from amongst the chemical formulas (a2-1-1), (a2-1-2), (a2-2-1), (a2-2-2), (a2-31), (a2-3-2), (a2-3-9), and (a2-3-10) is particularly preferred.

As the structural unit (a2), either a single structural unit may be used alone, or a combination of two or more different structural units may be used.

The proportion of the structural unit (a2) within the component (A), relative to the combined total of all the structural units that constitute the component (A), is preferably within a range from 10 to 80 mol %, even more preferably from 20 to 60 mol %, even more preferably from 25 to 50 mol %, and is most preferably from 35 to 50 mol %. Ensuring that this proportion is at least as large as the lower limit of the above range yields superior effects for the present invention, whereas ensuring that the proportion is no greater than the upper limit enables a more favorable balance to be achieved with the other structural units.

Structural Unit (a3)

The structural unit (a3) is a structural unit derived from an acrylate ester that contains a polar group-containing aliphatic hydrocarbon group. Including the structural unit (a3) enables the effects of the present invention to be obtained. Furthermore, the hydrophilicity of the component (A) is increased, and the affinity to a developer is also increased, which improves the alkali solubility of an exposed area, and contributes to the improvement of resolution.

Examples of the polar group include a hydroxyl group, a cyano group, a carboxyl group, and a hydroxyalkyl group in which a part of hydrogen atoms of the alkyl group have been substituted with fluorine atoms, and among these, a hydroxyl group is particularly preferred.

Examples of the aliphatic hydrocarbon group include a straight-chained or branched hydrocarbon group having 1 to 10 carbon atoms (preferably an alkylene group), or a polycyclic aliphatic hydrocarbon group (a polycyclic group). As the polycyclic group, for example, any one that is suitably selected from a plurality of components that have been suggested as a resin for a resist composition for an ArF excimer laser can be used.

Among these, more preferred is a constituent unit containing an aliphatic polycyclic group that contains a hydroxyl group, a cyano group, a carboxyl group, or a hydroxyalkyl group in which a part of hydrogen atoms of an alkyl group have been substituted with fluorine atoms, and derived from an acrylic acid ester. Examples of the polycyclic group include a group in which at least one hydrogen atom has been removed from bicycloalkane, tricycloalkane, tetracycloalkane, and the like. Specific examples thereof include a group in which at least one hydrogen atom has been removed from a polycycloalkane such as adamantane, norbornane, isobornane, tricyclodecane, and tetracyclododecane. These types of polycyclic groups can be selected appropriately from the multitude of groups proposed for use within the polymer (resin component) of resist compositions for use with ArF excimer lasers. Among these polycyclic groups, a group in which at least two hydrogen atoms have been removed from adamantane, a group in which at least two hydrogen atoms have been removed from norbornane, and a group in which at least two hydrogen atoms have been removed from tetracyclododecane are preferred, from an industrial veiwpoint.

As the constituent unit (a3), in the case where the hydrocarbon group of the polar group-containing aliphatic hydrocarbon group is a straight-chained or branched hydrocarbon group having 1 to 10 carbon atoms, a constituent unit derived from a hydroxyethylester of an acrylic acid is preferred. Further, in the case where the hydrocarbon group is a polycyclic group, for example, the constituent units represented by the following formulae (a3-1), (a3-2), and (a3-3) are preferably exemplified.

{Chemical Formula 19}

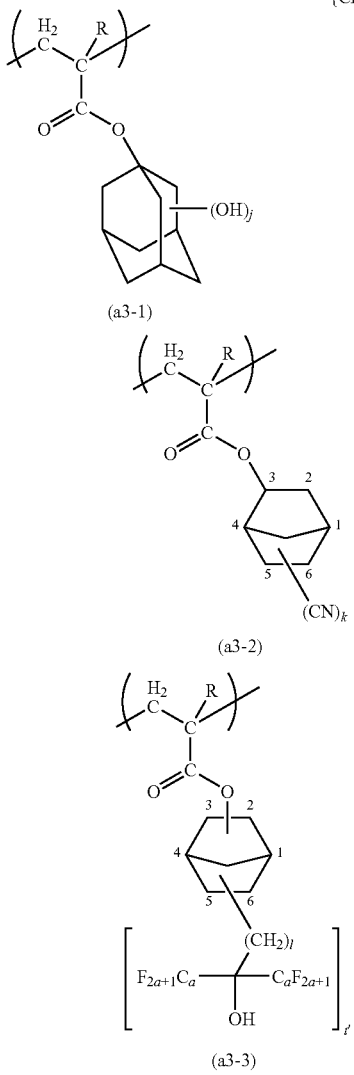

(a3-1)

(a3-2)

(a3-3)

[wherein R is the same as defined above, j is an integer of 1 to 3, k is an integer of 1 to 3, t' is an integer of 1 to 3, 1 is an integer of 1 to 5, and s is an integer of 1 to 3.]

In the formula (a3-1), j is preferably 1 or 2, and more preferably 1. If j is 2, a hydroxyl group is preferably bonded at 3- and 5-positions of the adamantyl group. If j is 1, a hydroxyl group is preferably bonded at a 3-position of the adamantyl group. j is preferably 1, and the hydroxyl group is particularly preferably bonded at a 3-position of the adamantyl group.

In the formula (a3-2), k is preferably 1. The cyano group is preferably bonded at a 5- or 6-position of the norbornyl group.

In the formula (a3-3), t' is preferably 1. 1 is preferably 1. s is preferably 1. Here, a 2-norbornyl group or a 3-norbornyl group is preferably bonded on a terminal of the carboxyl group of an acrylic acid. A fluorinated alkyl alcohol is preferably bonded at a 5- or 6-position of the norbornyl group.

Among those, in the formula (a3-1), j is preferably 1 and the hydroxyl group is particularly preferably bonded at a 3-position of the adamantyl group.

The constituent unit (a3) may be used alone, or in a combination of two or more kinds thereof.

The proportion of the constituent unit (a3) in the component (A) is preferably 5 to 50% by mole, more preferably 15 to 45% by mole, and still more preferably 15 to 35% by mole, based on the total amount of all the constituent units that constitute the component (A).

Constituent Unit (a4):

The component (A) may further include a constituent unit (a4), in addition to the above-described constituent units (a1) to (a3), within the range that does not interfere with the effects of the present invention.

The constituent unit (a4) is not particularly limited, as long as it is not classified into the constituent units (a1) to (a3). Thus, as the component (A), any one selected from a plurality of components that have been suggested to be used as a resin for a resist for an ArF excimer laser, and a resist composition for a KrF excimer laser, and the like (preferably for an ArF excimer laser), can be used.

As the constituent unit (a4), for example, a constituent unit containing an acid-undissociable aliphatic polycyclic group, and derived from an acrylic acid ester is preferred. Examples of the polycyclic group are the same as those mentioned in the case of the constituent unit (a1), and any one selected from a plurality of components that have been suggested to be used as a resin component of a resist composition for an ArF excimer laser, and a resist composition for a KrF excimer laser, and the like (preferably for an ArF excimer laser), can be used.

Particularly, at least one selected from a tricyclodecanyl group, an adamantyl group, a tetracyclododecanyl group, an isobornyl group, and a norbornyl group is preferred, in terms of industrial availability, etc. Each of these polycyclic groups may have a straight-chained or branched alkyl group having 1 to 5 carbon atoms as a substituent group.

Specific examples of the constituent unit (a4) include those having the structures represented by the following general formulae (a4-1) to (a4-5).

[Chemical Formula 20]

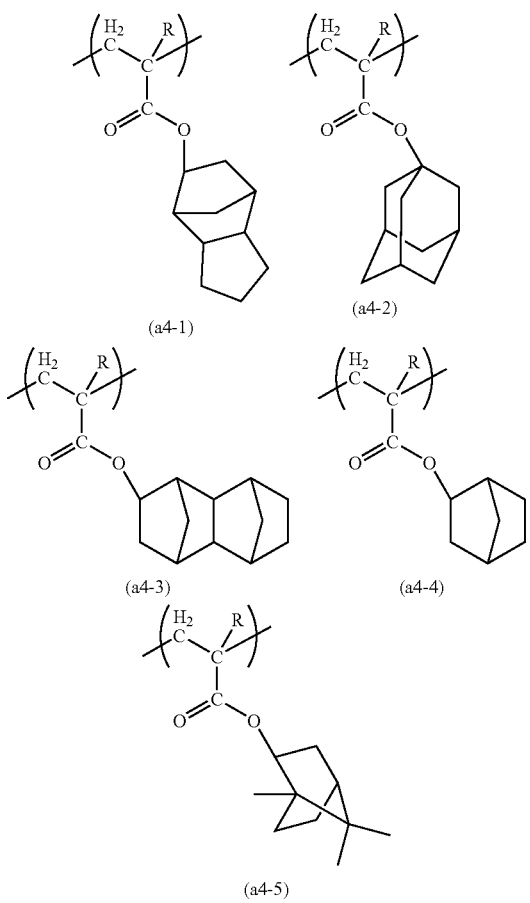

[wherein R is the same as defined above.]

When the constituent unit (a4) is contained in the component (A), it is contained in an amount of preferably 1 to 30% by mole, and more preferably 5 to 20% by mole, based on the total amount of all the constituent units that constitute the component (A).

The component (A1) can be obtained, for example, by a conventional radical polymerization or the like of the monomers that give rise to each of the structural units, using a radical polymerization initiator such as azobisisobutylonitrile (AIBN).

Furthermore, by also using a chain transfer agent such as HS—$CH_2$—$CH_2$—$CH_2$—$C(CF_3)_2$—OH during the above polymerization, —$C(CF_3)_2$—OH groups may be introduced at the copolymer terminals of the component (A1). A copolymer wherein hydroxyalkyl groups, in which a portion of the hydrogen atoms of the alkyl group have been substituted with fluorine atoms, have been introduced in this manner is effective in reducing the levels of developing defects and LER (Line Edge Roughness: uneven roughness on the side wall surface of the line).

The mass average molecular mass (Mw) of the component (A1) (as measured by gel permeation chromatography, in terms of polystyrene) is not particularly limited, but it is preferably 3000 to 50000, more preferably 3000 to 30000, and most preferably 5000 to 20000. If the mass average molecular mass is less than the upper limit, sufficient solubility in a resist solvent which allows the component to be used as a resist is improved. If the mass average molecular mass is more than the lower limit, dry etching resistance or the cross-sectional shape of a resist pattern is good.

Further, the dispersibility (Mw/Mn) is preferably 1.0 to 5.0, more preferably 1.0 to 3.0, and most preferably 1.2 to 25.

The proportion of the component (A1) within the component (A) is preferably 70% by weight or more, even more preferably 80% by weight or more, most preferably from 100% by weight.

A resin component other than the component (A1), for example, a conventional resin component for positive resist compositions can be also used in the component (A). The quantity of the component (A) within the positive resist composition of the present invention can be adjusted appropriately in accordance with the thickness of the resist film that is to be formed.

Specific examples of the preferable polymer compound (A1) as the component (A) include the components represented by the below general formulas (A11) to (A22).

[Chemical Formula 21]

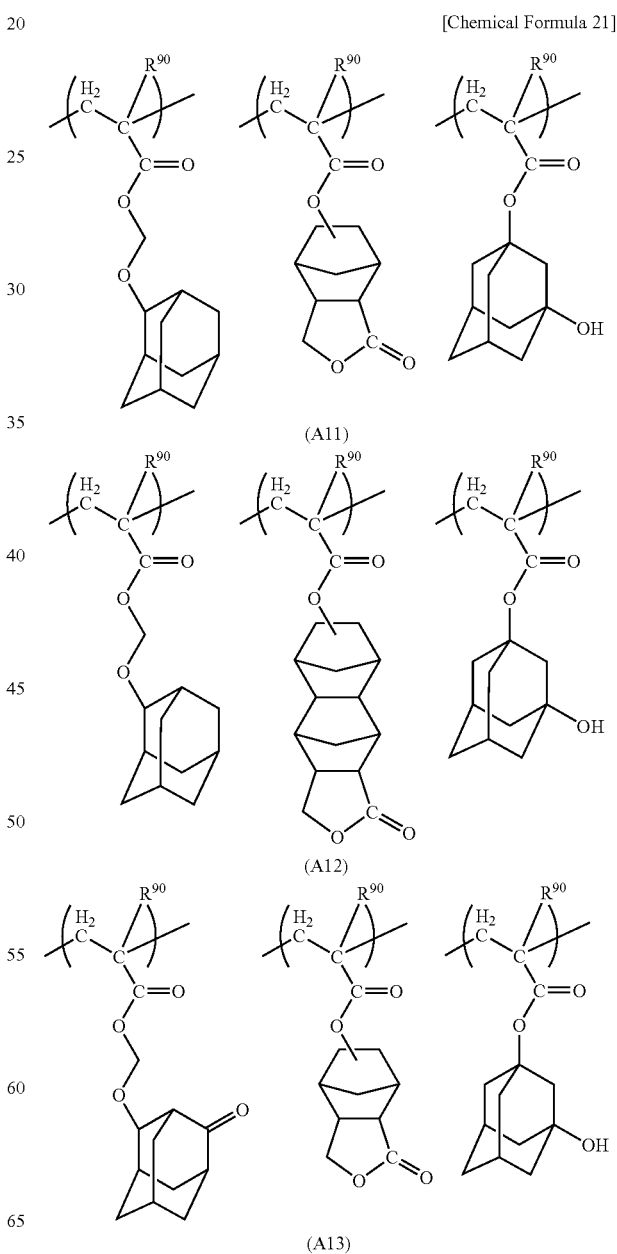

-continued
[Chemical Formual 22]
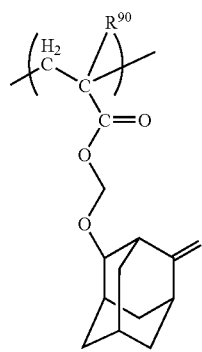 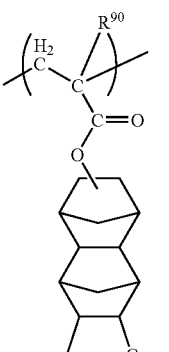 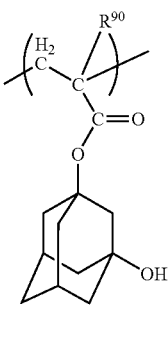
(A14)
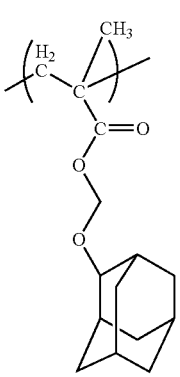 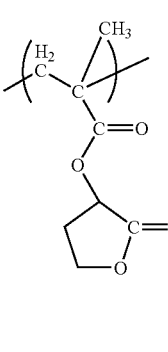 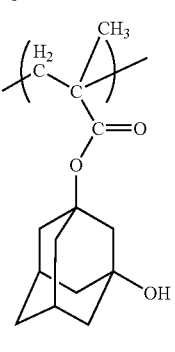
(A17)
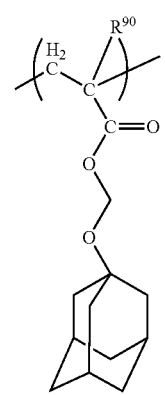 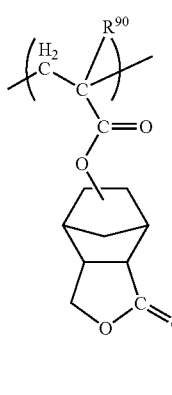 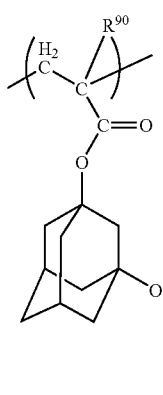
(A15)
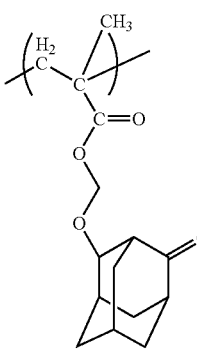 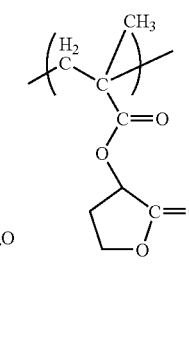 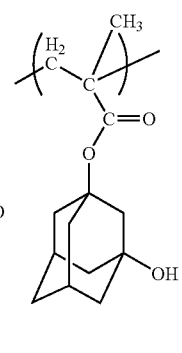
(A18)
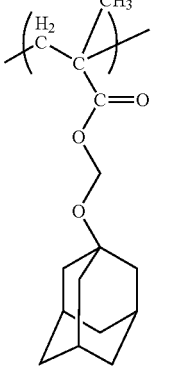 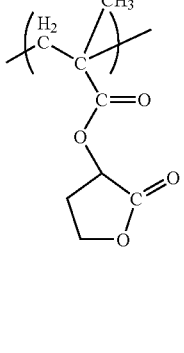 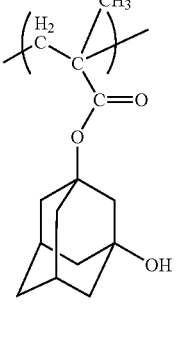
(A19)
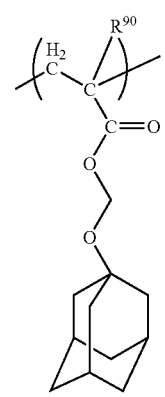 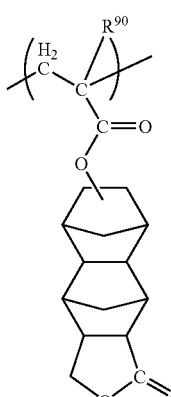 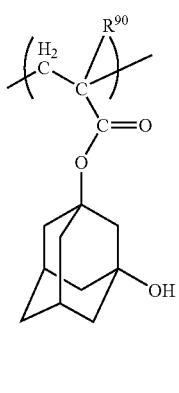
(A16)
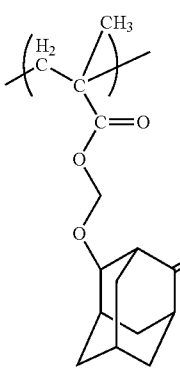 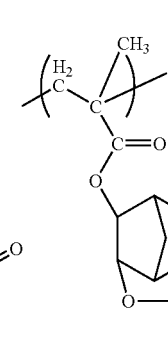 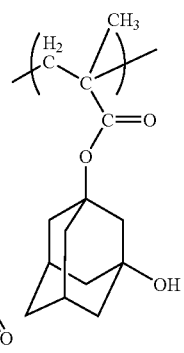
(A20)
[wherein, $R^{90}$ represents a hydrogen atom, a methyl group, a fluorine atom or a trifluoromethyl group]

-continued

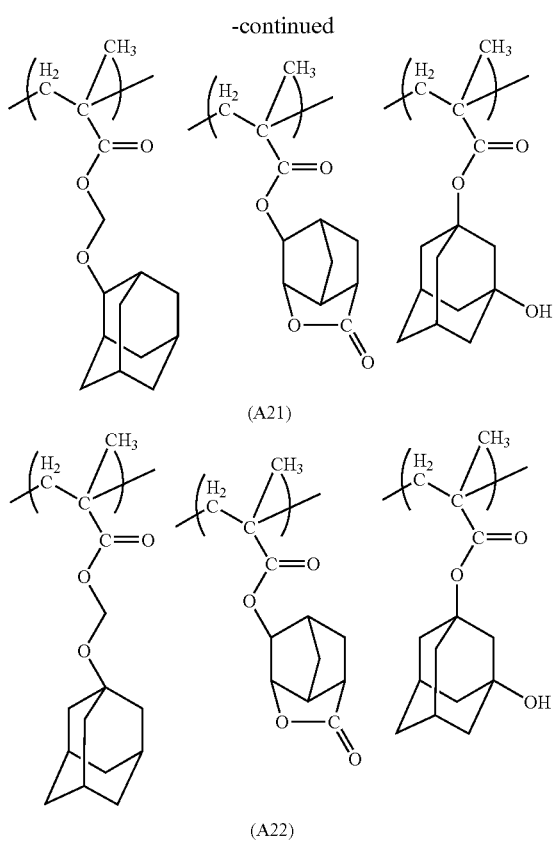

(A21)

(A22)

The $R^{90}$ is preferably a hydrogen atom or a methyl group.

Of the above general formulas (A11) to (A22), the general formulas (A11) and (A17) are particularly desirable since the effects of the present invention are further improved.

<Acid Generator Component (B)>

[Component (B1)]

In the present invention, the onium salt-based acid generators (B1) having the cation portion represented by the above general formula (b-1) which is used as the component (B) is an essential component in the present application.

In the general formula (b-1), $R^{11}$ represents an alkyl group, an alkoxy group, a halogen atom or a hydroxyl group and n' represents either 0 or an integer from 1 to 3. When n' represents an integer 2 or 3, the plurality of $R^{11}$ may be the same as or different from each other.

The $R^{11}$ group is preferably an alkyl group of 1 to 5 carbon atoms, and a methyl group, an ethyl group, a propyl group, n-butyl group, tert-butyl group are the most desirable.

The $R^{11}$ group is preferably an alkoxy group, of 1 to 5 carbon atoms, and a methoxy group and an ethoxy group are the most desirable.

The $R^{11}$ group is preferably a halogen atom which is a fluorine atom.

The n' represents either 0 or an integer 1, and preferably 1.

In the above general formula (b-1), $R^{12}$ and $R^{13}$ each represents, independently, an aryl group or an alkyl group that may have a substituent group.

There are no particular restrictions on the $R^{12}$ and $R^{13}$ which are an aryl group, for example, the $R^{12}$ and $R^{13}$ are preferably an aryl group of 6 to 20 carbon atoms. The aryl group. The aryl group can be substituted for There are no particular restrictions on the aryl groups of $R^{12}$ to $R^{13}$, and suitable examples include aryl groups of 6 to 20 carbon atoms, in which either a portion of, or all of, the hydrogen atoms of these aryl groups may be either substituted, or not substituted, with alkyl groups, alkoxy groups, or halogen atoms and the like. In terms of enabling low-cost synthesis, aryl groups of 6 to 10 carbon atoms are preferred. Specific examples of suitable groups include a phenyl group and a naphthyl group.

The alkyl groups that may be used for substitution of the hydrogen atoms of the above aryl groups are as defined above for $R^{11}$ and suitable examples of the $R^{11}$ include the same groups as those exemplified above.

The alkoxy groups that may be used for substitution of the hydrogen atoms of the above aryl groups are as defined above for $R^{11}$ and suitable examples of the $R^{11}$ include the same groups as those exemplified above.

Halogen atoms that may be used for substitution of the hydrogen atoms of the above aryl groups are as defined above for $R^{11}$ and suitable examples of the $R^{11}$ include the same groups as those exemplified above.

There are no particular restrictions on the alkyl groups of $R^{12}$ to $R^{13}$, and suitable examples include straight-chained, branched, or cyclic alkyl groups of 1 to 15 carbon atoms. From the viewpoint of achieving excellent resolution, alkyl groups of 1 to 5 carbon atoms are preferred. Specific examples include a methyl group, ethyl group, n-propyl group, isopropyl group, n-butyl group, isobutyl group, n-pentyl group, cyclopentyl group, hexyl group, cyclohexyl group, nonyl group, and decanyl group, although in terms of achieving superior resolution and enabling low-cost synthesis, a methyl group is the most desirable.

Both of the $R^{12}$ and $R^{13}$ are the most preferable phenyl groups.

There are no particular restrictions on the anion portion within the component (B1), and any of the anion portions used within conventional onium salt-based acid generators can be used.

For example, anion portions represented by a general formula "$R^{14}$—$SO_3^-$ (wherein, $R^{14}$ represents a straight-chained, branched or cyclic alkyl group, or a fluorinated alkyl group)", the general formula (b-3) below or the general formula (b-4) below can be used.

[Chemical Formula 23]

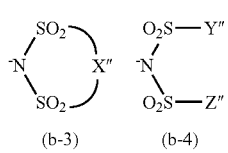

(b-3)  (b-4)

[wherein, X" represents an alkylene group of 2 to 6 carbon atoms in which at least one hydrogen atom has been substituted with a fluorine atom; and Y" and Z" each represents, independently, an alkyl group of 1 to 10 carbon atoms in which at least one hydrogen atom has been substituted with a fluorine atom]

In the above general formula "$R^{14}$—$SO_3^-$", $R^{14}$ represents a straight-chained, branched or cyclic alkyl group, or a fluorinated alkyl group.

The $R^{14}$ is preferably a straight-chained or branched alkyl group of 1 to 10 carbon atoms, more preferably of 1 to 8 carbon atoms, and most preferably of 1 to 4 carbon atoms.

The $R^{14}$ is preferably a cyclic alkyl group which is defined above for $R^{12}$ and $R^{13}$ of 4 to 15 carbon atoms, more preferably of 4 to 10 carbon atoms, and most preferably of 6 to 10 carbon atoms.

The $R^{14}$ is preferably a fluorinated alkyl group of 1 to 10 carbon atoms, more preferably of 1 to 8 carbon atoms, and most preferably of 1 to 4 carbon atoms. Furthermore, the fluorination rate of the fluorinated alkyl group (the proportion of the fluorine atoms substituted by fluorination in all of the hydrogen atoms in the alkyl group before fluorination) is preferably 10 to 100%, still more preferably 50 to 100%, and particularly those in which all of the hydrogen atoms have been substituted with fluorine atoms, thus giving strong acidity, are preferred.

The $R^{14}$ is more preferably a straight-chained or cyclic alkyl group, or a fluorinated alkyl group.

In the above general formula (b-3), the group X" is a straight-chained or branched alkylene group in which at least one hydrogen atom has been substituted with a fluorine atom, and the number of carbon atoms within the alkylene group is typically within a range from 2 to 6, preferably from 3 to 5, and is most preferably 3.

In the above general formula (b-4), Y" and Z" each represents, independently, a straight-chained or branched alkyl group in which at least one hydrogen atom has been substituted with a fluorine atom, and the number of carbon atoms within the alkyl group is typically within a range from 1 to 10, preferably from 1 to 7, and is most preferably from 1 to 3.

Within the above ranges for the numbers of carbon atoms, lower numbers of carbon atoms within the alkylene group X" or the alkyl groups Y" and Z" result in better solubility within the resist solvent, and are consequently preferred.

Furthermore, in the alkylene group X" or the alkyl groups Y" and Z", the larger the number of hydrogen atoms that have been substituted with fluorine atoms the stronger the acid becomes favorably. The fluorine atom proportion within the alkylene group or alkyl groups, namely the fluorination ratio, is preferably within a range from 70 to 100%, and even more preferably from 90 to 100%, and perfluoroalkylene groups or perfluoroalkyl groups in which all of the hydrogen atoms have been substituted with fluorine atoms are the most desirable.

The anion portion in component (B1) is preferably the anion portion represented by the general formula (b-3), more preferably wherein X" is a perfluoroalkylene group.

Specific examples of the component (B1) include (b1-01) to (b1-08) below.

[Chemical Formula 24]

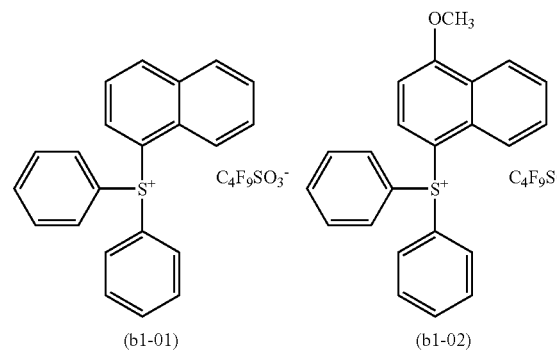

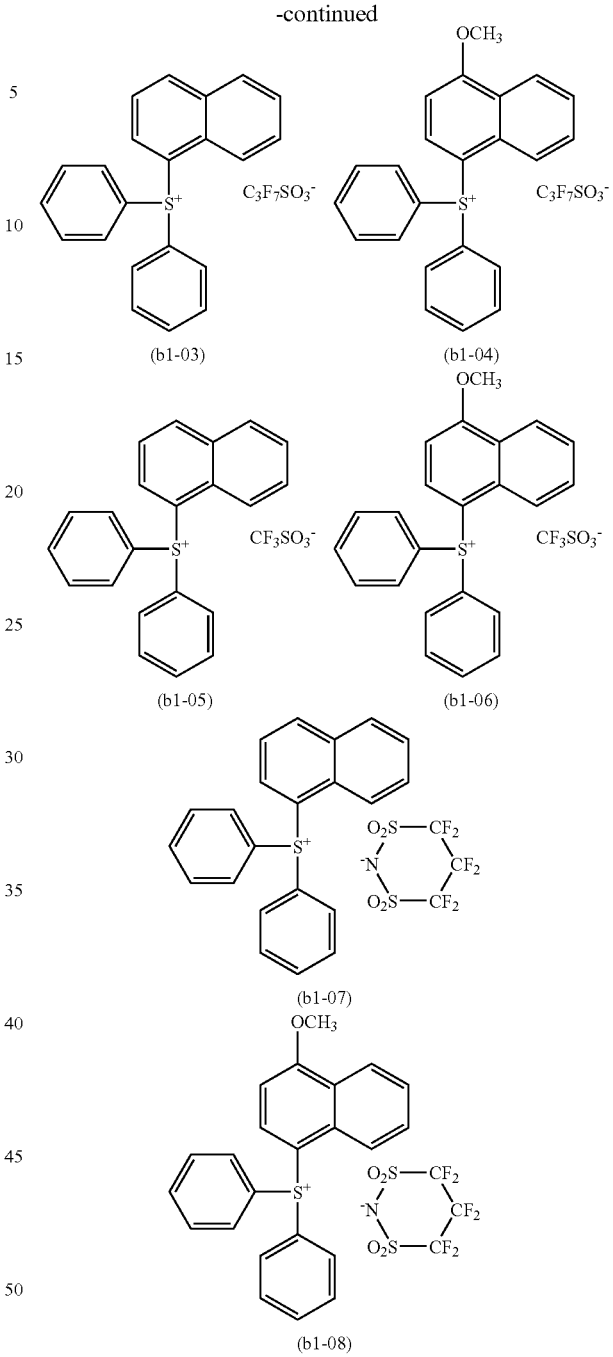

Of these, the acid generators represented by chemical formulas (b1-07) or (b1-08) are particularly preferable.

The component (B1) may use either a single compound, or a combination of two or more different compounds.

The proportion of the component (B1) within the entire component (B) is preferably 40% by weight or more, and may be 100% by weight. Even more preferable ranges are from 40 to 90% by weight, most preferably from 50 to 85% by weight.

[Component (B2)]

Including an acid generator (B2) represented by a general formula (b-2) below besides the component (B1) within the component (B) is preferred. The component (B2) does not coincide with the component (B1). That is, the cation portions within the component (B2) do not include "a naphthyl group which may contain substituent groups".

[Chemical Formula 25]

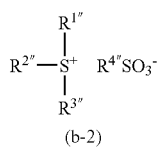

(b-2)

[wherein, $R^{4'''}$ represents a straight-chained, branched or cyclic alkyl group, or fluoroalkyl group; $R^{1'''}$ to $R^{3'''}$ represents, independently, an aryl group or alkyl group that may have substituent groups, and at least one of $R^{1'''}$ to $R^{3'''}$ represents an aryl group]

In the formula (b-2), $R^{1'''}$ to $R^{3'''}$ represents, independently, an aryl group or alkyl group that may have substituent groups. When $R^{1'''}$ to $R^{3'''}$ represent an aryl group, a naphthyl group is excluded.

Of the groups $R^{1'''}$ to $R^{3'''}$, at least one group represents an aryl group. Compounds in which at least two of $R^{1'''}$ to $R^{3'''}$ represent aryl groups are preferred, and compounds in which all of $R^{1'''}$ to $R^{3'''}$ are aryl groups are the most preferred.

There are no particular restrictions on the aryl groups of $R^{1'''}$ to $R^{3'''}$ other than a naphthyl group, and suitable examples include aryl groups of 6 to 20 carbon atoms, in which either a portion of, or all of, the hydrogen atoms of these aryl groups may be either substituted, or not substituted, with alkyl groups, alkoxy groups, or halogen atoms and the like. In terms of enabling low-cost synthesis, aryl groups of 6 to 10 carbon atoms are preferred. Specific examples of suitable groups include a phenyl group.

Alkyl groups that may be used for substitution of the hydrogen atoms of the above aryl groups are preferably alkyl groups of 1 to 5 carbon atoms, and a methyl group, ethyl group, propyl group, n-butyl group or tert-butyl group is the most desirable.

Alkoxy groups that may be used for substitution of the hydrogen atoms of the above aryl groups are preferably alkoxy groups of 1 to 5 carbon atoms, and a methoxy group or ethoxy group is the most desirable.

Halogen atoms that may be used for substitution of the hydrogen atoms of the above aryl groups are preferably fluorine atoms.

There are no particular restrictions on the alkyl groups of $R^{1'''}$ to $R^{3'''}$, and suitable examples include straight-chained, branched, or cyclic alkyl groups of 1 to 15 carbon atoms. From the viewpoint of achieving excellent resolution, alkyl groups of 1 to 5 carbon atoms are preferred. Specific examples include a methyl group, ethyl group, n-propyl group, isopropyl group, n-butyl group, isobutyl group, n-pentyl group, cyclopentyl group, hexyl group, cyclohexyl group, nonyl group, and decanyl group, although in terms of achieving superior resolution and enabling low-cost synthesis, a methyl group is the most desirable.

Of the above options, all of the $R^{1'''}$ to $R^{3'''}$ groups are most preferably phenyl groups.

$R^{4'''}$ represents a straight-chained, branched or cyclic alkyl group or fluorinated alkyl group.

The straight-chained or branched alkyl group preferably has 1 to 10 carbon atoms, more preferably 1 to 8 carbon atoms, and most preferably 1 to 4 carbon atoms.

The cyclic alkyl group is preferably a cyclic alkyl group represented by the above $R^{1'''}$ having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. The fluorination rate of the fluorinated alkyl group is preferably 10 to 100%, still more preferably 50 to 100%, and particularly those in which all of the hydrogen atoms have been substituted with fluorine atoms, thus providing strong acidity, are preferred.

As $R^{4'''}$, a straight-chained or cyclic alkyl group, or a fluorinated alkyl group is most preferred.

Specific examples of component (B2) include triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate. Further examples include onium salts in which the anion portion of the above onium salts has been substituted with a methanesulfonate, n-propanesulfonate, n-butanesulfonate or n-octanesulfonate ion.

The component (B2) may use either a single compound, or a combination of two or more different compounds.

In those cases where the component (B2) is included, the proportion of the component (B2) within the entire component (B) is preferably within a range from 10 to 60% by weight, even more preferably from 15 to 50% by weight, and is most preferably from 20 to 40% by weight.

[Another Acid Generator (B3)]

Although the component (B) may further have known acid generators conventionally used for a chemically amplified resist composition (hereafter also referred to as other acid generator (B3)), the proportion of the component (B1) and the component (B2) within the entire component (B) is preferably 80% by weight or more, and more preferably 100% by weight.

The other acid generator (B3) includes known acid generators such as an onium salt-based acid generator (for example, a iodonium salt) other than the onium salt-based acid generators (B1) and (B2), oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

The other acid generator (B3) may use either a single compound, or a combination of two or more different compounds.

The quantity of the component (B) within the positive resist composition of the present invention is typically within a range from 2 to 20 parts by weight, is preferably from 5 to 15 parts by weight, and most preferably from 5 to 13 parts by weight per 100 parts by weight of the component (A). Ensuring the quantity satisfies this range enables satisfactory pattern formation and good characteristics to be achieved. Moreover, a uniform solution can be obtained, and the storage stability can be further improved.

Nitrogen-Containing Organic Compound (D)

In the positive resist composition of the present invention, in order to improve the resist pattern shape and the post-exposure stability of the latent image formed by the pattern-wise exposure of the resist layer, a nitrogen-containing organic compound (D) (hereafter referred to as the component (D)) may be added as an optional component.

A multitude of these nitrogen-containing organic compounds have already been proposed, and any of these known compounds can be used, although an aliphatic amine, and particularly a secondary aliphatic amine or tertiary lower aliphatic amine is preferred.

Examples of these aliphatic nines include amines in which at least one hydrogen atom of ammonia ($NH_3$) has been substituted with an alkyl group or hydroxyalkyl group of no more than 12 carbon atoms (that is, alkylamines or alkyl alcohol amines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethyl amine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n octanolamine. Of these, alkyl alcohol amines and trialkyl amines are preferred, and alkyl alcohol amines are the most desirable. Amongst the various alkyl alcohol amines, triethanolamine and triisopropanolamine are the most preferred.

These compounds may be used either alone, or in combinations of two or more different compounds.

The component (D) is typically used in a quantity within a range from 0.01 to 5.0 parts by weight per 100 parts by weight of the component (A).

Component (E)

Furthermore, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter referred to as the component (E)) may also be added to the positive resist composition of the present invention as another optional component. The component (D)) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Organic Solvent (S)

the positive resist composition of the present invention can be produced by dissolving the materials in an organic solvent (hereafter also referred to as organic solvent (S)).

The organic solvent may be any solvent capable of dissolving the various components used to generate a uniform solution, and one or more solvents selected from known materials used as the solvents for conventional chemically amplified resists can be used.

Examples of the solvent include lactones such as γ-butyrolactone, ketones such as acetone, methyl ethyl ketone, cyclohexanone, methyl isoamyl ketone and 2-heptanone, polyhydric alcohols and derivatives thereof such as ethylene glycol, ethylene glycol monoacetate, diethylene glycol, diethylene glycol monoacetate, propylene glycol, propylene glycol monoacetate, dipropylene glycol, monomethyl ether, monoethyl ether, monopropyl ether, monobutyl ether or monophenyl ether of dipropylene glycol monoacetate, cyclic ethers such as dioxane, and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

Of these, in order to prevent a resist pattern footing (footing) and obtain a resist pattern shape with a more desirable rectangular formability, propylene glycol monomethyl ether (POME) is preferable.

Of these mixed solvents, mixed solvents produced by mixing propylene glycol monomethyl ether acetate (PGMEA) with a polar solvent are preferred. Although the blend ratio (weight ratio) in such mixed solvents can be set in accordance with factors such as the co-solubility of the PGMEA and the polar solvent, the ratio is preferably within a range from 1:9 to 9:1, and is even more preferably from 2:8 to 8:2.

Examples of suitable mixed solvents are PGME, EL or the like, and preferably PGME.

In the case where PGME is added as the polar solvent, the blending ratio (weight ratio) of PGMEA:PGME is preferably within a range from 9:1 to 1:9, more preferably from 9:2 to 2:8 and most preferably from 7:3 to 4:6.

Furthermore, in the case where EL is added as the polar solvent, the weight ratio of PGMEA:EL is preferably within a range from 1:9 to 9:1, and more preferably from 2:8 to 8:2.

A mixed solvent of at least one selected from PGMEA and EL, and γ-butyrolactone, is also preferred. In such cases, the mixture proportion (weight ratio) of the former and latter components is preferably within a range from 70:30 to 95:5.

The amount of organic solvent used is not particularly limited, but it is suitably selected according to the applied film thickness at a concentration which allows application to a substrate. Generally, the amount of organic solvent used is in an amount such that the solid concentration of the resist composition is in the range of from 2 to 20% by weight, and preferably from 5 to 15% by weight.

<Other Optional Components>

Other miscible additives can also be added to the positive resist composition of the present invention according to need, and examples include additive resins for improving the performance of the resist film, surfactants for improving the coating properties, dissolution inhibitors, plasticizers, stabilizers, colorants, halation prevention agents, and dyes and the like.

<<Resist Pattern Forming Method>>

A method of forming a resist pattern according to the present invention can be conducted, for example, using the method described below.

Namely, the positive resist composition described above is first applied to a substrate such as a silicon wafer using a spinner or the like, and a prebake is then conducted under temperature conditions of 80 to 150° C., for a period of 40 to 120 seconds, and preferably for 60 to 90 seconds, thereby forming a resist film. Subsequently, following selective exposure of the resist film, for example with an ArF excimer laser through a desired mask pattern using an ArF exposure apparatus, PEB (post exposure baking) is conducted under temperature conditions of 80 to 150° C. for 40 to 120 seconds, and preferably for 60 to 90 seconds.

Subsequently, developing is conducted using an alkali developing liquid such as an aqueous solution of tetramethylammonium hydroxide with a concentration of 0.1 to 10% by weight.

In this manner, a resist pattern that is faithful to the mask pattern can be obtained.

An organic or inorganic anti-reflective film may also be provided between the substrate and the applied layer of the resist composition.

If required, a post-bake step may be conducted following the developing treatment.

There are no particular restrictions on the wavelength used for the exposure, and an ArF excimer laser, KrF excimer laser, $F_2$ excimer laser, or other radiation such as EUV (extreme ultra violet), VUV (vacuum ultra violet), EB (electron beam), X-ray or soft X-ray radiation can be used. The resist composition according to the present invention is particularly effective for use with an ArF excimer laser.

The present application provides a positive resist composition and a resist pattern forming method which can reduce the fluctuation in pattern size while the exposure varies.

The reasons for these observations are not entirely clear, but it is believed that the positive resist composition in the present invention absorbs exposure light moderately and the component (B) can achieve a characteristics significantly which enormously prevent a change in acid generation efficiency on exposure since the component (B1) includes a naphthalene ring with respect to the fluctuation in pattern size especially. Therefore, it is believed that a positive resist composition can be realized which prevents the fluctuation in pattern size while exposure varies.

The present invention can form a resist pattern which contributes to a reduction in the LER and an improvement in the shape.

The positive resist composition in the present invention can suppress pattern collapse.

Moreover, the present invention can achieve a pattern with a good shape, especially, prevent a pattern footing (footing). Though the pattern footing easily occurs in forming resist pattern on an organic anti-reflective film, the present invention can prevent this footing. Furthermore, a resist pattern with good cross-sectional rectangular formability can be obtained. It is believed that the acid generation efficiency of the component (B) is mild; the constituent unit (a1) has a so-called an acetal type acid dissociable, dissolution inhibiting group and is easily dissociated under a weak acid, the constituent units (a2) and (a3) have hydrophilic characteristics, and the like.

By virtue of these effects, the positive resist composition in the present invention can improve the resolution.

Furthermore, the present invention can achieve these excellent characteristics without any degradation in sensitivity.

EXAMPLES

As follows is a description of examples of the present invention, although the scope of the present invention is in no way limited by these examples.

<Component (A)>

[Synthesis of a Monomer]

Synthesis of (2-adamantyloxymethyl)methacrylate 6.9 g of methacrylic acid was dissolved in 200 ml of tetrahydrofuran, and 8.0 g of triethylamine was added. Following stirring at room temperature, a solution containing 15 g of 2-adamantyl chloromethyl ether dissolved in 100 ml of tetrahydrofuran was added dropwise to the reaction solution. Following stirring for 12 hours at room temperature, the precipitated salt was removed by filtration. The solvent was removed from the remaining filtrate by evaporation, the residue was dissolved in 200 ml of ethyl acetate, and following washing with pure water (100 ml×3), the solvent was removed by evaporation. The residue was then allowed to stand under ice cooling, thereby yielding a white solid.

Results of measuring the infrared absorption spectrum (IR) and the proton nuclear magnetic resonance spectrum ($^1$H-NMR) are shown below.

IR (cm$^{-1}$): 2907, 2854 (C—H stretch) 1725 (C=O stretch), 1638 (C=C stretch)

$^1$H-NMR (CDCl$_3$, internal standard: tetramethylsilane) ppm: 1.45 to 2.1 (m, 17H), 3.75 (s, 1H), 5.45 (s, 2H), 5.6 (s, 1H), 6.12 (s, 1H)

The obtained compound ((2-adamantyloxymethyl)methacrylate) is represented by a chemical formula shown below.

Compound E-1

[Chemical Formula 26]

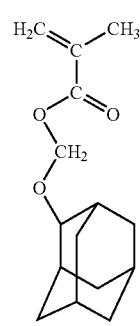

[Synthesis of Resin (A)-1]

20.0 g of the (2-adamantyloxymethyl)methacrylate obtained in the above synthesis, 13.6 g of γ-butyrolactone methacrylate, and 9.5 g of 3-hydroxy-(1-adamantyl)methacrylate were dissolved in 200 ml of tetrahydrofuran, and 1.64 g of azobisisobutyronitrile was added.

Following refluxing for 12 hours, the reaction solution was added dropwise to 2 L of n-heptane.

The precipitated resin was collected by filtration and dried under reduced pressure, yielding a white resin powder (resin (A)-1).

The structure of the resin (A)-1 is shown below.

The results of a GPC measurement of the resin (A)-1 revealed a weight average molecular weight (Mw) of 7,000 and a polydispersity (Mw/Mn) of 2.0.

Furthermore, analysis by carbon-13 nuclear magnetic resonance spectroscopy ($^{13}$C-NMR) revealed a compositional ratio (molar ratio) between the different structural units shown in the structural formula below of a1:b1:c1=4:4:2.

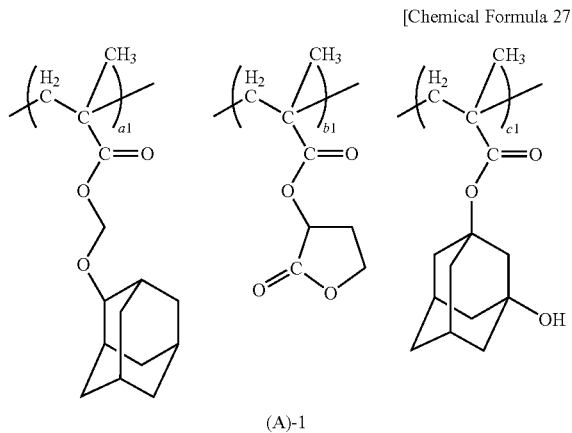

(A)-1

[Synthesis of Resin (A)-2]

With the exception of using 20.0 g of the (2-adamantyloxymethyl)methacrylate obtained in the above synthesis, 18.9 g of norbornanelactone methacrylate, and 9.5 g of 3-hydroxy-1-adamantyl)methacrylate, synthesis of resin (A)-2 was conducted in the same manner as synthesis of resin (A)-1.

The results of a GPC measurement of the resin (A)-2 revealed a weight-average molecular weight (Mw) of 7,000 and a polydispersity (Mw/Mn) of 2.0.

Furthermore, analysis by carbon-13 nuclear magnetic resonance spectroscopy ($^{13}$C-NMR) revealed a compositional ratio (molar ratio) between the different structural units shown in the structural formula below of a2:b2:c2=4:4:2.

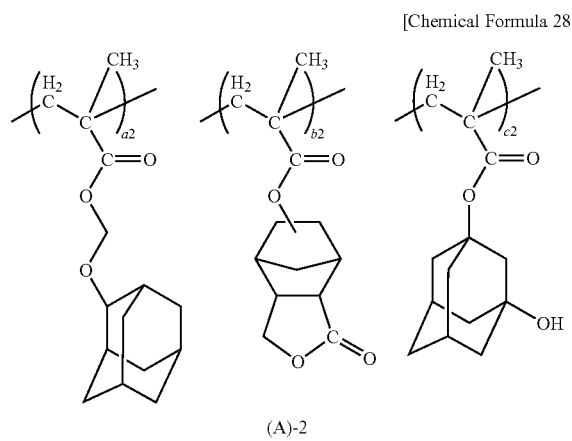

(A)-2

[Synthesis of Resin (A)-3]

With the exception of using 18.7 g of the 2-methyl-2-adamantyl)methacrylate, 13.6 g of γ-butyrolactone methacrylate, and 9.5 g of 3-hydroxy-(1-adamantyl)methacrylate, synthesis of resin (A)3 was conducted in the same manner as synthesis of resin (A)-1.

The results of a GPC measurement of the resin (A)-3 revealed a weight average molecular weight (Mw) of 10,000 and a polydispersity (Mw/Mn) of 2.0.

Furthermore, analysis by carbon-13 nuclear magnetic resonance spectroscopy ($^{13}$C-NMR) revealed a compositional ratio (molar ratio) between the different structural units shown in the structural formula below of a3:b3:c3=4:4:2.

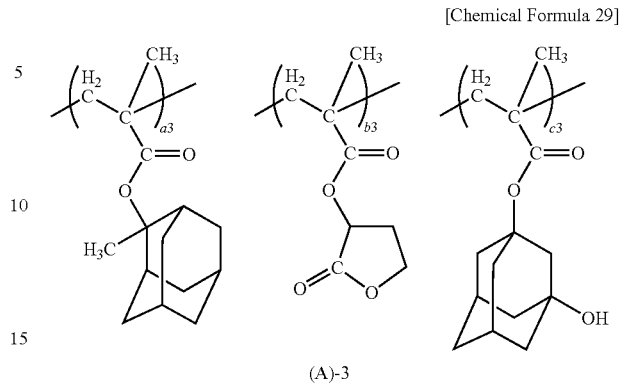

(A)-3

Examples 1 to 2, Comparative Example 1

The components shown in Table 1 were mixed together and dissolved, yielding a series of positive resist composition solutions.

In Table 1, the numerical values shown within the parentheses [ ] represent blend quantities (parts by weight).

TABLE 1

|  | (A) | (B) | (S) | (D) |
|---|---|---|---|---|
| Example 1 | (A)-1 [100] | (B)-1 [3.0] (B)-2 [1.6] | (S1) [750] | (D)-1 [0.30] |
| Example 2 | (A)-2 [100] | (B)-1 [3.0] (B)-2 [1.6] | (S1) [750] | (D)-1 [0.30] |
| Comparative Example 1 | (A)-3 [100] | (B)-2 [2.0] | (S1) [750] | (D)-1 [0.25] |

<Component (B)>

(B)-1: a compound represented by the below chemical formula

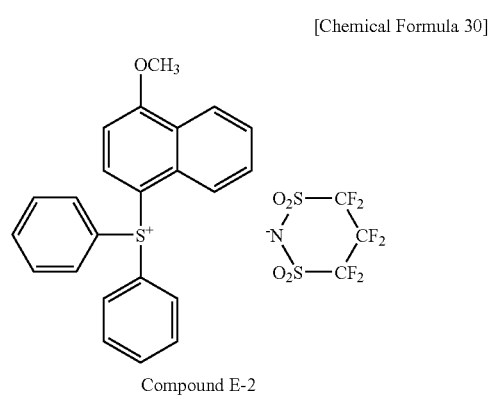

Compound E-2

(B)-2: (4-methylphenyl)diphenylsulfonium nonafluorobutanesulfonate

<Component (S)>

(S1): Mixed solvent of PGMEA/PGME=6/4 (weight ratio)

<Component (D)>

(D)-1: Triethanolamine.

<Evaluation>

Subsequently, using the prepared positive resist composition solutions, the evaluations described below were conducted.

An organic anti-reflective film composition "AR46" product name, manufactured by Rohm and Haas Ltd.) was applied to the surface of an 8-inch silicon wafer using a spinner, and the composition was then baked and dried on a hotplate at 215° C. for 60 seconds, thereby forming an organic anti-reflective film with a film thickness of 31 nm.

The positive resist composition solution was then applied to the surface of this anti-reflective film using a spinner, and was then prebaked (post-applied bake: PAB) and dried on a hotplate for 90 seconds at the PAB temperature shown in Table 2, thereby forming a resist film with a film thickness of 180 nm shown in Table 2.

Subsequently, this film was selectively irradiated with an ArF excimer laser (193 nm) through a mask pattern (a 6% permeable half-tone mask), using an ArF exposure apparatus NSR-S306C (manufactured by Nikon Corporation; NA (Numerical aperture)=0.78, Dipole).

The resist was then subjected to PEB (post-exposure baking) treatment for 90 seconds at the PEB temperature shown in Table 2, was subsequently subjected to puddle development for 60 seconds at 23° C. in a 2.38% by weight aqueous solution of tetramethylammonium hydroxide (TMAH), was then washed for 30 seconds with water and dried, and was then post-baked for 60 seconds at 100° C., thus forming a line and space pattern (hereafter referred to as a L/S pattern) with a line width of 80 nm of 1:1.

TABLE 2

|  | PAB temperature (° C.) | PEB temperature (° C.) |
|---|---|---|
| Example 1 | 110 | 115 |
| Example 2 | 125 | 130 |
| Comparative Example 1 | 120 | 135 |

The exposure dose (sensitivity) at which an 80 nm L/S pattern was formed with a ratio of line width:space width=1:1 was set as Eop, and for the 80 nm IS pattern (1:1) obtained at this Eop value, the EL margin and the LER were evaluated.

The evaluation results are shown in Table 3.

<EL Margin>

The variation of the pattern size per exposure 1 mJ (unit: nm/mJ) within the range where the 80 nm L/S pattern was obtained in a range from 80 nm±10% was measured and this EL margin (exposure margin) (unit: %) was calculated. It was shown that the higher the value of the EL margin changed, the less the variation of the pattern size accompanying the fluctuation of exposure became. The results are shown in Table 3.

<LER>

The 3σ value was determined, which is a measure of the LER.

The 3σ value is determined by measuring the resist pattern width of the sample at 32 positions using a measuring SEM (product name: S-9360, manufactured by Hitachi, Ltd.), and calculating the value of 3 times the standard deviation σ (namely, 3σ) from these measurement results. The smaller this 3σ value is, the lower the level of roughness, indicating a resist pattern with a uniform width. The measurement voltage was 300 V.

TABLE 3

|  | Example 1 | Example 2 | Comparative Example 1 |
|---|---|---|---|
| EL margin (The variation of the pattern size) | 18.4% (1.8 nm/mJ) | 21.3% (1.5 nm/mJ) | 13.1% (4.4 nm/mJ) |
| LER (3σ) | 6.6 nm | 6.4 nm | 7.6 nm |

As is evident from the above Table 3 results, Examples in the present invention show good EL margins and a reduced level of LER.

INDUSTRIAL APPLICABILITY

The present application provides a positive resist composition and a resist pattern forming method which can reduce the fluctuation in pattern size while the exposure varies.

What is claimed is:

1. A positive resist composition, comprising:
    a resin component (A) that exhibits increased alkali solubility under action of acid, and
    an acid generator component (B) that generates acid on exposure to radiation, wherein said resin component (A) comprises a polymer compound (A1),
wherein said polymer compound (A1) comprises one or more structural units (a1) selected from the group consisting of structural units represented by general formulas (a1-2) and (a1-4) shown below:

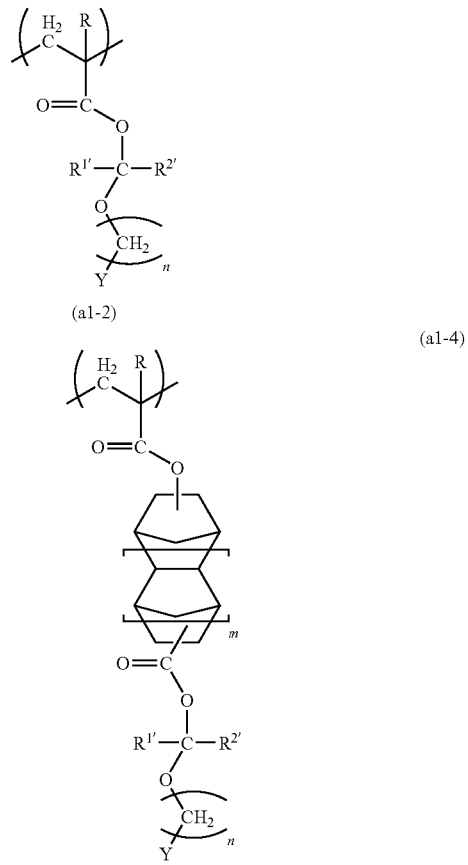

[wherein, Y represents a lower alkyl group of 1 to 5 carbon atoms or an aliphatic cyclic group; n represents either 0 or an integer from 1 to 3; m represents either 0 or 1; R represents a hydrogen atom, fluorine atom, lower alkyl group of 1 to 5 carbon atoms, or fluorinated lower alkyl group of 1 to 5 carbon atoms; and $R^{1'}$ and $R^{2'}$ each represent, independently, a hydrogen atom or a lower alkyl group of 1 to 5 carbon atoms],

- a structural unit (a2) derived from an acrylate ester that contains a lactone-containing monocyclic or polycyclic group, and
- a structural unit (a3) derived from an acrylate ester that comprises a polar group-containing aliphatic hydrocarbon group; and
- said component (B) comprises: an onium salt-based acid generator (B1) having a cation portion represented by a general formula (b-1) shown below:

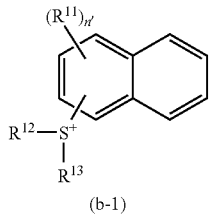

(b-1)

[wherein, $R^{11}$ represents an alkyl group, an alkoxy group, a halogen atom or a hydroxyl group; $R^{12}$ to $R^{13}$ each represents, independently, an aryl group that may have substituent groups; n' represents either 0 or an integer from 1 to 3], wherein the anion portion within the component (B1) is an anion represented by the general formula (b-3) below or the general formula (b-4) below:

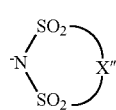

(b-3)

-continued

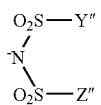

(b-4)

[wherein, X″ represents an alkylene group of 2 to 6 carbon atoms in which at least one hydrogen atom has been substituted with a fluorine atom; and Y″ and Z″ each represents, independently, an alkyl group of 1 to 10 carbon atoms in which at least one hydrogen atom has been substituted with a fluorine atom].

2. The positive resist composition according to claim 1, wherein said component (B) further comprises an onium salt-based acid generator (B2) other than (B1), wherein (B2) is represented by the general formula (b-2) shown below:

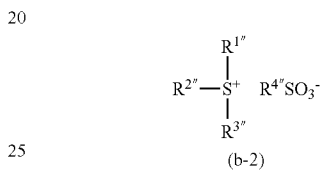

(b-2)

[wherein, $R^{4''}$ represents a straight-chained, branched or cyclic alkyl group, or fluoroalkyl group; $R^{1''}$ to $R^{3''}$ represents, independently, an aryl group or alkyl group that may have substituent groups, and at least one of $R^{1''}$ to $R^{3''}$ represents an aryl group]

3. A positive resist composition according to claim 1, further comprising a nitrogen-containing organic compound (D).

4. A resist pattern forming method, comprising:
   forming a resist film on a substrate using the positive resist composition according to claim 1;
   conducting selective exposure of said resist film; and
   alkali developing said resist film to form a resist pattern.

* * * * *

UNITED STATES PATENT AND TRADEMARK OFFICE
CERTIFICATE OF CORRECTION

PATENT NO. : 7,781,144 B2
APPLICATION NO. : 11/914509
DATED : August 24, 2010
INVENTOR(S) : Kinoshita et al.

It is certified that error appears in the above-identified patent and that said Letters Patent is hereby corrected as shown below:

Column 4, Line 51 change "structure" to --structural--.

Column 6, Line 9 change "viewpoint" to --viewpoint,--.

Column 6, Line 13-14 (Approx.) change "-C($R^1$)$R^2$)-O($CH_2$)$_n$-Y" to -- -C($R^1$)($R^2$)-O($CH_2$)$_n$-Y--.

Column 24, Line 19 (Approx.) change "-C($R^1$)$R^2$)-O($CH_2$)$_n$-Y" to -- -C($R^1$)($R^2$)-O($CH_2$)$_n$-Y--.

Column 24, Line 42 (Approx.) Below " 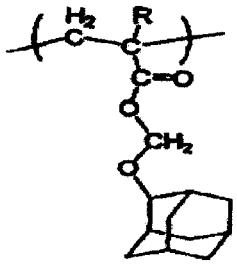 " insert --(3)--.

Column 34, Line 19 change "(a2-31)," to --(a2-3-1),--.

Column 38, Line 2 change "25." to --2.5.--.

Column 43, Line 37 change "atoms" to --atoms,--.

Column 47, Line 15 (Approx.) change "nines" to --amines--.

Column 47, Line 30 (Approx.) change "tri-n octanolamine." to --tri-n-octanolamine.--.

Column 47, Line 50 change "(D))" to --(D)--.

Column 48, Line 2 change "the positive" to --The positive--.

Signed and Sealed this
Twenty-second Day of March, 2011

David J. Kappos
*Director of the United States Patent and Trademark Office*

CERTIFICATE OF CORRECTION (continued)
U.S. Pat. No. 7,781,144 B2

Column 48, Line 26 change "(POME)" to --(PGME)--.

Column 50, Line 21 (Approx.) change "(C-H stretch)" to --(C-H stretch),--.

Column 51, Line 24-25 (Approx.) change "3-hydroxy-1-adamantyl)" to --3-hydroxy-(1-adamantyl)--.

Column 51, Line 56-57 (Approx.) change "2-methyl-2-adamantyl)" to --2-methyl-(2-adamantyl)--.

Column 51, Line 59 (Approx.) change "(A)3" to --(A)-3--.

Column 52, Line 43-44 change "formula" to --formula.--.

Column 53, Line 8-9 change "product" to --(product--.

Column 53, Line 45 change "IS" to --L/S--.

Column 56, Line 29 in Claim 2, change "$R^{1'}$" to --$R^{1''}$--.

Column 56, Line 32 in Claim 2, change "group]" to --group].--.